(12) United States Patent
Choi et al.

(10) Patent No.: US 10,777,553 B2
(45) Date of Patent: Sep. 15, 2020

(54) INTEGRATED CIRCUIT DEVICE AND METHOD OF MANUFACTURING THE SAME

(71) Applicant: Samsung Electronics Co., Ltd., Suwon-si (KR)

(72) Inventors: Jung-hyuck Choi, Seoul (KR); Hae-wang Lee, Yongin-si (KR); Hyoun-jee Ha, Hwaseong-si (KR); Chul-hong Park, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/363,050

(22) Filed: Mar. 25, 2019

(65) Prior Publication Data

US 2019/0221563 A1 Jul. 18, 2019

Related U.S. Application Data

(63) Continuation of application No. 15/849,030, filed on Dec. 20, 2017, now Pat. No. 10,319,720.

(30) Foreign Application Priority Data

Jul. 5, 2017 (KR) .......... 10-2017-0085408

(51) Int. Cl.
*H01L 27/088* (2006.01)
*H01L 23/528* (2006.01)
(Continued)

(52) U.S. Cl.
CPC ........ *H01L 27/0886* (2013.01); *H01L 21/762* (2013.01); *H01L 21/76895* (2013.01); *H01L 21/76897* (2013.01); *H01L 21/823418* (2013.01); *H01L 21/823431* (2013.01); *H01L 21/823437* (2013.01); *H01L 21/823468* (2013.01); *H01L 21/823475* (2013.01); *H01L 21/823481* (2013.01); *H01L 23/528* (2013.01); *H01L 23/5226* (2013.01); *H01L 23/535* (2013.01); *H01L 27/0924* (2013.01); *H01L 29/0649* (2013.01); *H01L 29/0847* (2013.01); (Continued)

(58) Field of Classification Search
CPC ................ H01L 23/5283; H01L 21/823475
See application file for complete search history.

(56) References Cited

U.S. PATENT DOCUMENTS 6,468,857 B2 10/2002 Igarashi et al.
6,627,528 B1 9/2003 Ishimaru
(Continued)

*Primary Examiner* — Farun Lu
(74) *Attorney, Agent, or Firm* — Muir Patent Law, PLLC

(57) ABSTRACT

An integrated circuit device may include a fin-type active region extending in a first direction on a substrate; an insulating separation structure extending in a second direction that intersects the first direction on the fin-type active region; a pair of split gate lines spaced apart from each other with the insulating separation structure therebetween and extending in the second direction to be aligned with the insulating separation structure; a pair of source/drain regions located on the fin-type active region and spaced apart from each other with the insulating separation structure therebetween; and a jumper contact located over the insulating separation structure and connected between the pair of source/drain regions.

15 Claims, 39 Drawing Sheets

(51) Int. Cl.
| | |
|---|---|
| *H01L 29/08* | (2006.01) |
| *H01L 23/535* | (2006.01) |
| *H01L 23/522* | (2006.01) |
| *H01L 29/45* | (2006.01) |
| *H01L 21/8234* | (2006.01) |
| *H01L 29/66* | (2006.01) |
| *H01L 29/06* | (2006.01) |
| *H01L 21/768* | (2006.01) |
| *H01L 21/762* | (2006.01) |
| *H01L 29/417* | (2006.01) |
| *H01L 27/092* | (2006.01) |
| *H03K 19/0944* | (2006.01) |

(52) U.S. Cl.
CPC ........ *H01L 29/41791* (2013.01); *H01L 29/45* (2013.01); *H01L 29/66545* (2013.01); *H01L 29/665* (2013.01); *H03K 19/0944* (2013.01)

(56) References Cited

U.S. PATENT DOCUMENTS

| | | | |
|---|---|---|---|
| 7,109,076 | B2 | 9/2006 | Sakai et al. |
| 7,183,187 | B2 | 2/2007 | Lu et al. |
| 9,385,133 | B2 | 7/2016 | Morimoto et al. |
| 2004/0084704 | A1 | 5/2004 | Tang et al. |
| 2014/0332871 | A1 | 11/2014 | Kim et al. |
| 2016/0005851 | A1 | 1/2016 | Song et al. |
| 2016/0020210 | A1 | 1/2016 | Liaw |
| 2016/0056155 | A1* | 2/2016 | Park ................ H01L 29/41758 257/401 |
| 2016/0118303 | A1 | 4/2016 | Kuo et al. |
| 2016/0308008 | A1* | 10/2016 | Yeo ...................... H01L 29/408 |
| 2017/0018620 | A1 | 1/2017 | Liu et al. |
| 2017/0062445 | A1 | 3/2017 | Yamashita |
| 2017/0098641 | A1 | 4/2017 | Jung |
| 2017/0154967 | A1 | 6/2017 | Huang et al. |
| 2017/0154968 | A1* | 6/2017 | Park ................ H01L 29/41791 |

* cited by examiner

Y1 – Y1'

Y1 – Y1'

X1 – X1'

X1 – X1'

X1 – X1'

INTEGRATED CIRCUIT DEVICE AND METHOD OF MANUFACTURING THE SAME

CROSS-REFERENCE TO RELATED APPLICATION

This application is a Continuation of U.S. patent application Ser. No. 15/849,030, filed on Dec. 20, 2017, now allowed, which claims the benefit of Korean Patent Application No. 10-2017-0085408, filed on Jul. 5, 2017, in the Korean Intellectual Property Office, the disclosure of each of which is incorporated herein in its entirety by reference.

BACKGROUND

The present disclosure relates to an integrated circuit device and a method of manufacturing the same, and more particularly, to an integrated circuit device including a contact in the form of a plug and a method of manufacturing the integrated circuit device.

Due to developments in electronics technology, integrated circuit devices have been rapidly downscaled. Since highly downscaled integrated circuits require not only a high operating speed but also an operation accuracy, there is a demand for integrated circuit devices that may reduce an area of wirings and contacts in a relatively small space and may stably ensure an insulating distance between the wirings and the contacts and a method of manufacturing the integrated circuit device.

SUMMARY

The present disclosure provides an integrated circuit device that, even when the number of wirings and contacts formed at the same level in the integrated circuit device having a device region with a reduced area according to downscaling is increased, may minimize an area of an inter-device isolation region and may stably ensure an insulating distance between the contacts.

The present disclosure also provides a method of manufacturing an integrated circuit device that, even when the number of wirings and contacts formed at the same level in the integrated circuit device having a device region with a reduced area according to downscaling is increased, may minimize an area of an inter-device isolation region and may stably ensure an insulating distance between the contacts.

According to an aspect of the inventive concept, there is provided an integrated circuit device including: a fin-type active region extending in a first direction on a substrate; an insulating separation structure extending in a second direction that intersects the first direction on the fin-type active region; a pair of split gate lines spaced apart from each other with the insulating separation structure therebetween and extending to be aligned with the insulating separation structure in the second direction; a pair of source/drain regions located on the fin-type active region and spaced apart from each other with the insulating separation structure therebetween; and a jumper contact located over the insulating separation structure and connected between the pair of source/drain regions.

According to another aspect of the inventive concept, there is provided an integrated circuit device including: a plurality of fin-type active regions extending parallel to each other in a first direction on a substrate; an insulating separation structure extending in a second direction that intersects the first direction on the plurality of fin-type active regions; a pair of split gate lines spaced apart from each other with the insulating separation structure therebetween and extending in the second direction to be aligned with the insulating separation structure; a plurality of source/drain regions formed on the plurality of fin-type active regions; and a jumper contact extending in the first direction between first and second source/drain regions of the plurality of source/drain regions, the first and second source/drain regions being spaced apart from each other with the insulating separation structure therebetween. The jumper contact passes over the insulating separation structure to connect the first and second source/drain regions to each other.

According to another aspect of the inventive concept, there is provided a method of manufacturing an integrated circuit device, the method including: forming a fin-type active region extending in a first direction on a substrate; forming a pair of source/drain regions on the fin-type active region; forming an insulating separation structure extending in a second direction that intersects the first direction between the pair of source/drain regions; forming a pair of split gate lines spaced apart from each other with the insulating separation structure therebetween and extending in the second direction to be aligned with the insulating separation structure; and forming a jumper contact located over the insulating separation structure and connecting the pair of source/drain regions between the pair of source/drain regions.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
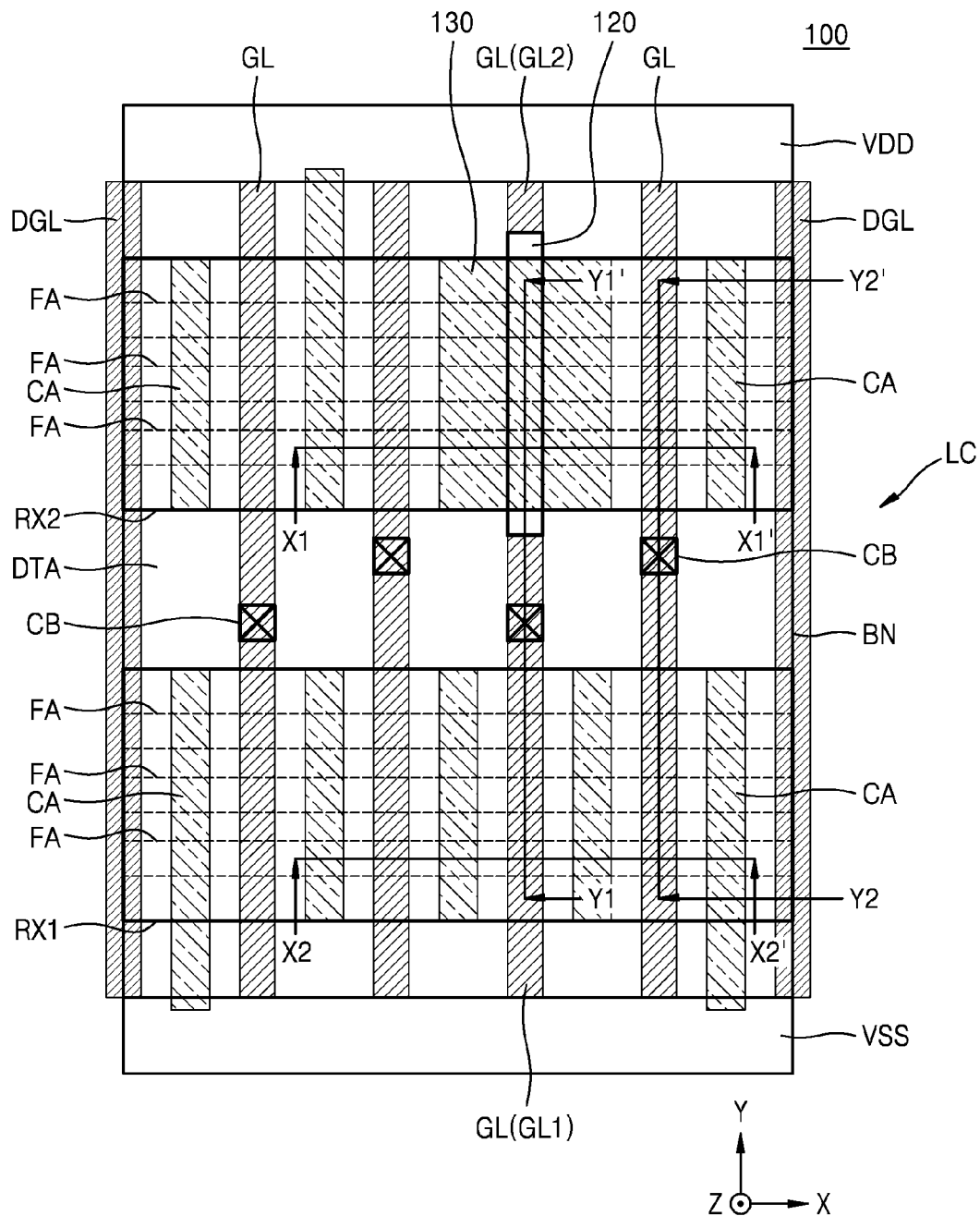
FIG. 1 is a planar layout diagram for explaining an integrated circuit device according to example embodiments.

The present disclosure will now be described more fully with reference to the accompanying drawings, in which embodiments are shown. In the drawings, the same elements are denoted by the same reference numerals, and thus a repeated explanation thereof will not be given.

Figure 2A:
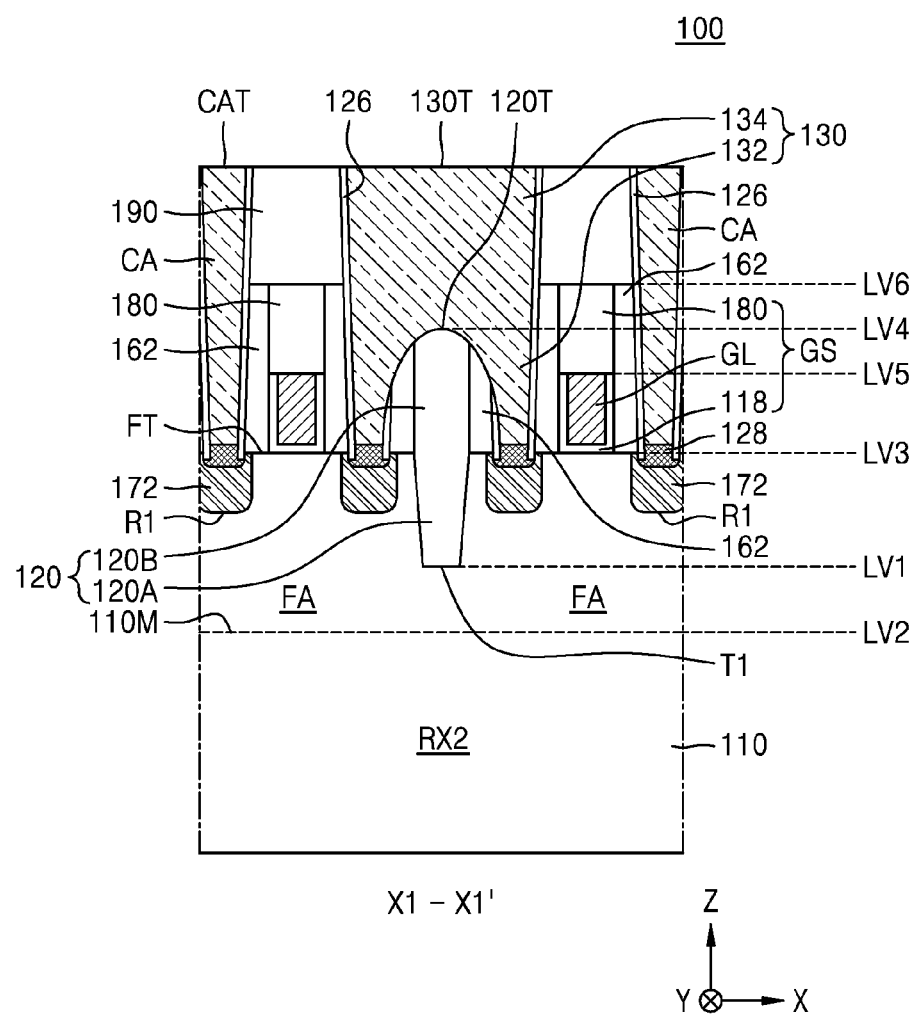
FIG. 2A is a cross-sectional view taken along line X1-X1' of FIG. 1 according to example embodiments.
Figure 2B:
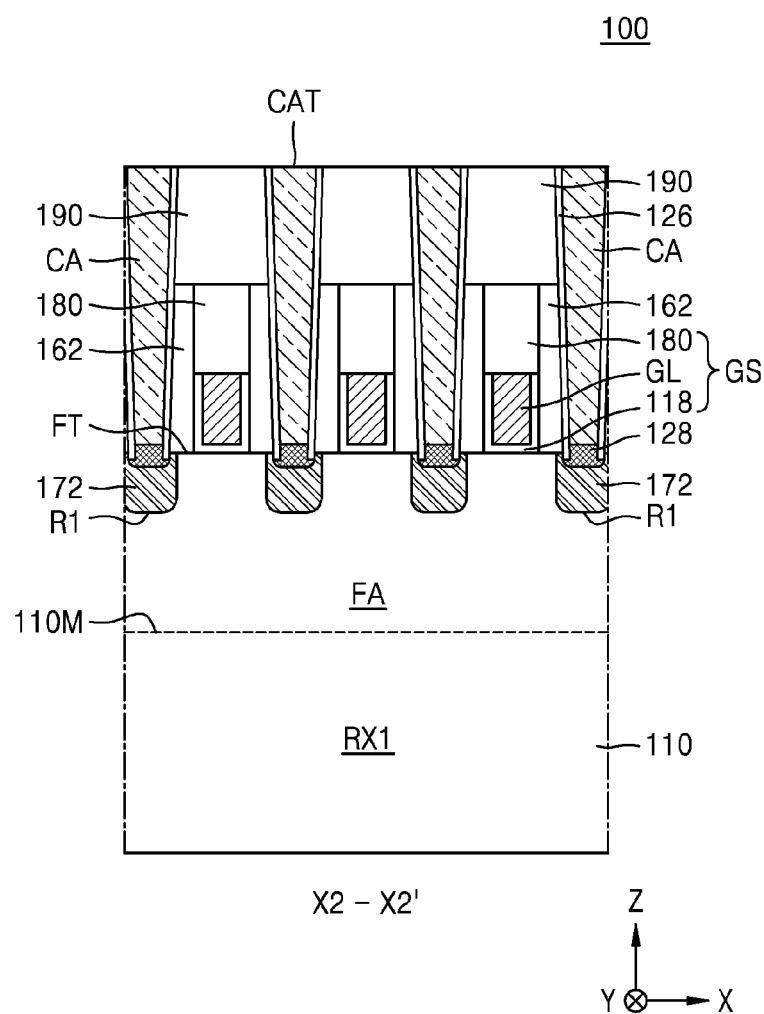
FIG. 2B is a cross-sectional view taken along line X2-X2' of FIG. 1 according to example embodiments.
Figure 2C:
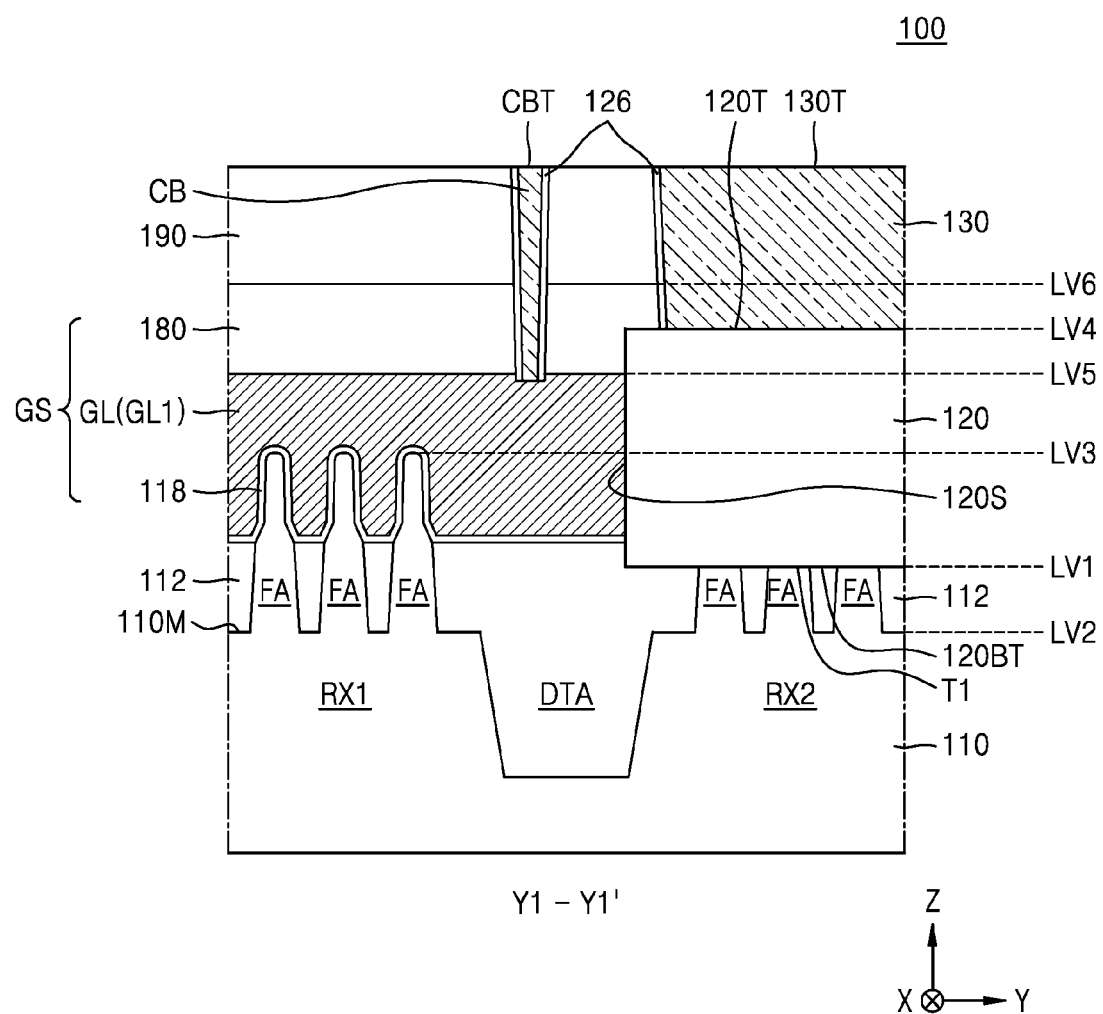
FIG. 2C is a cross-sectional view taken along line Y1-Y1' of FIG. 1 according to example embodiments.
Figure 2D:
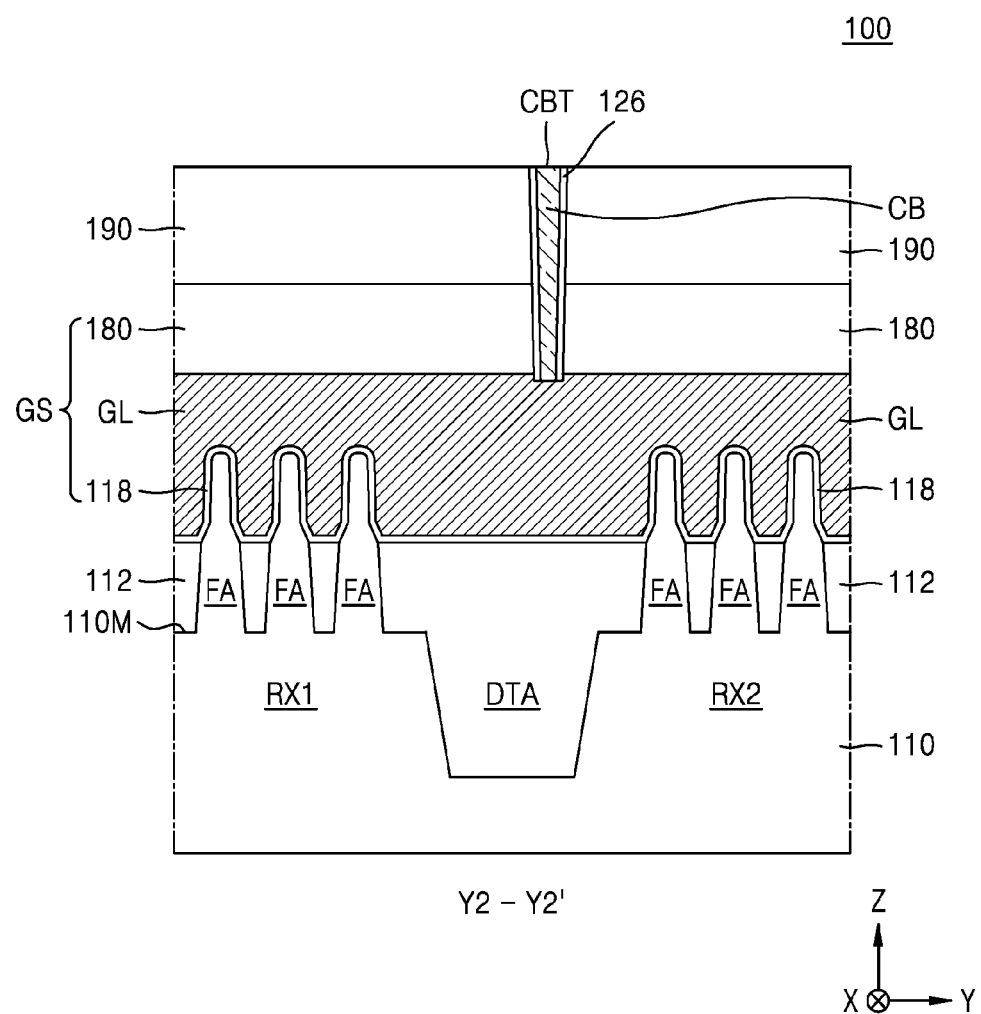
FIG. 2D is a cross-sectional view taken along line Y2-Y2' of FIG. 1 according to example embodiments.

FIGS. 1 through 2D are views for explaining an integrated circuit device 100 according to example embodiments. FIG. 1 is a planar layout diagram illustrating main elements of the integrated circuit device 100. FIG. 2A is a cross-sectional view taken along line X1-X1' of FIG. 1 according to example embodiments. FIG. 2B is a cross-sectional view taken along line X2-X2' of FIG. 1 according to example embodiments. FIG. 2C is a cross-sectional view taken along line Y1-Y1' of FIG. 1 according to example embodiments. FIG. 2D is a cross-sectional view taken along line Y2-Y2' of FIG. 1 according to example embodiments. The integrated circuit device 100 of FIGS. 1 through 2D may include a logic cell including a fin field-effect transistor (FinFET) device.

Referring to FIGS. 1 through 2D, the integrated circuit device 100 includes a logic cell LC formed in a region defined by a cell boundary BN on a substrate 110.

The substrate 110 has a main surface 110M extending in a horizontal direction (e.g., an X-Y plane direction). The substrate 110 may include a semiconductor such as silicon (Si) or germanium (Ge), or a compound semiconductor such as SiGe, SiC, GaAs, InAs, or InP. The substrate 110 may include a conductive region, for example, a well doped with impurities, or a structure doped with impurities.

The logic cell LC includes a first device region RX1 and a second device region RX2. A plurality of fin-type active regions FA protruding from the substrate 110 are formed in the first device region RX1 and the second device region RX2. An inter-device separation region DTA may be located between the first device region RX1 and the second device region RX2.

The plurality of fin-type active regions FA may be parallel to one another and extend in a width direction (e.g., an X direction) of the logic cell LC. As shown in FIG. 2C, a device isolation film 112 may be formed on the substrate 110 in the inter-device isolation region DTA and a region between the plurality of fin-type active regions FA, and the plurality of fin-type active regions FA may protrude upward in the form of fins beyond the device isolation film 112 in the first device region RX1 and the second device region RX2.

A plurality of gate dielectric films 118 and a plurality of gate lines GL are located on the substrate 110 and extend in a height direction (e.g., a Y direction) of the logic cell LC that intersects the plurality of fin-type active regions FA. The plurality of gate lines GL may be referred to as normal gate lines GL. The plurality of gate dielectric films 118 and the plurality of gate lines GL may extend to cover top surfaces and both side walls of the plurality of fin-type active regions FA and a top surface of the device isolation film 112. A plurality of metal-oxide semiconductor (MOS) transistors may be formed along the plurality of gate lines GL in the first device region RX1 and the second device region RX2. The plurality of MOS transistors may be three-dimensional MOS transistors having channels formed on the top surfaces and the both side walls of the plurality of fin-type active regions FA.

Dummy gate lines DGL may extend along portions of the cell boundary BN extending in the height direction (e.g., the Y direction) of the logic cell LC. Although the dummy gate lines DGL may be formed of the same material as that of the plurality of gate lines GL, the dummy gate lines DGL may function as electrical separation regions between the logic cell LC and other logic cells (or, circuits) around the logic cell LC by maintaining an electrically floating state while the integrated circuit device 100 operates.

The dummy gate lines DGL may be conductive lines formed at the same level and adjacent to the plurality of gate lines GL (e.g., normal gate lines). A dummy gate line is patterned from the same conductive layer(s) forming such normal gate lines. For example, a dummy gate line may be simultaneously formed with a normal gate line with the same processes that deposit and pattern the conductive layer(s) forming normal gate lines. Dummy gate lines in integrated circuit devices (e.g., electronic devices, logic devices or memory devices) are not effective to cause transmission of data to external devices. For instance, a dummy gate line may not be electrically connected to gates of logic cells or memory cells, or if a dummy gate line is electrically connected to gates of dummy logic cells or memory cells, such dummy gate lines may not be activated or if activated, may not result in communication of any data in such dummy logic cells or memory cells to a source external to the logic device or memory device.

The plurality of gate lines GL and the plurality of dummy gate lines DGL may have the same width in the width direction (e.g., the X direction) of the logic cell LC and may be arranged at constant pitches in the width direction (e.g., the X direction). For example, a distance between two adjacent gate lines GL in the width direction (e.g., the X direction) from among the plurality of gate lines GL of the logic cell LC and a distance between the dummy gate line DGL and the gate line GL closest to the dummy gate line DGL in the width direction (e.g., the X direction) may be the same.

A plurality of gate dielectric films 118 may include a silicon oxide film, a high-k film, or a combination thereof. The high-k film may be formed of a material having a dielectric constant that is greater than that of the silicon oxide film. The high-k film may be formed of metal oxide or metal oxynitride. An interface film (not shown) may be located between the fin-type active regions FA and the gate dielectric films 118. The interface film may include an oxide film, a nitride film, or an oxynitride film.

Each of the plurality of gate lines GL and the plurality of dummy gate lines DGL may have a structure in which a metal nitride layer, a metal layer, a conductive capping layer, and a gap-fill metal film are sequentially stacked. Each of the metal nitride layer and the metal layer may include at least one metal selected from among titanium (Ti), tantalum (Ta), tungsten (W), ruthenium (Ru), niobium (Nb), molybdenum (Mo), and hafnium (Hf). The gap-fill metal film may include a W film or an aluminum (Al) film. Each of the plurality of gate lines GL and the plurality of dummy gate lines DGL may include a work function metal-containing layer. The work function metal-containing layer may include at least one metal selected from among Ti, W, Ru, Nb, Mo, Hf, nickel (Ni), cobalt (Co), platinum (Pt), ytterbium (Yb), dysprosium (Dy), erbium (Er), and palladium (Pd). In some embodiments, each of the plurality of gate lines GL and the plurality of dummy gate lines DGL may include, but are not limited to, a stacked structure including TiAlC/TiN/W, a stacked structure including TiN/TaN/TiAlC/TiN/W, or a stacked structure including TiN/TaN/TiN/TiAlC/TiN/W.

Top surfaces of the plurality of gate lines GL, the plurality of gate dielectric films 118, and the plurality of dummy gate lines DGL may be covered by gate insulating capping layers 180. The plurality of gate insulating capping layers 180 may include silicon nitride films. The gate dielectric films 118, the gate lines GL, and the gate insulating capping layers 180 sequentially stacked on the fin-type active regions FA may constitute a gate structure GS.

A plurality of insulating spacers 162 may linearly extend in a longitudinal direction (e.g., the Y direction) of the logic cell LC to cover both side walls of the plurality of gate lines GL and the plurality of dummy gate lines DGL. The plurality of insulating spacers 162 may include silicon nitride films, SiOCN films, SiCN films, or a combination thereof.

An interlayer insulating film 190 that covers the plurality of gate structures GS and the plurality of dummy gate lines DGL may be formed on the substrate 110. The interlayer insulating film 190 may include a silicon oxide film, a silicon nitride film, or a combination thereof.

A plurality of source/drain regions 172 may be formed on the plurality of fin-type active regions FA to be located at both sides of each of the plurality of gate lines GL. One gate line GL and one of the source/drain regions 172 are spaced apart from each other with the gate dielectric film 118 and the insulating spacer 162 therebetween. The plurality of source/drain regions 172 may include a semiconductor epitaxial layer that is epitaxially grown from a plurality of recess portions R1 formed in the fin-type active regions FA or a combination thereof. The plurality of source/drain regions 172 may include an epitaxially grown Si layer, an epitaxially grown SiC layer, or a plurality of epitaxially grown SiGe layers. Some of the plurality of source/drain regions 172 may be covered by an inter-gate insulating film 164 (see FIG. 10B). The inter-gate insulating film 164 may include a silicon oxide film.

A plurality of source/drain contact plugs CA are formed on the plurality of source/drain regions 172. The plurality of source/drain regions 172 may be connected to an upper conductive line (not shown) through the plurality of source/drain contact plugs CA.

At least one insulating separation structure 120 extending in a direction parallel to the plurality of gate lines GL may be formed on the fin-type active regions FA in the second device region RX2 of the logic cell LC. Although one insulating separation structure 120 is formed in the second device region RX2 of the integrated circuit device 100 of FIGS. 1 through 2D, the inventive concept is not limited thereto and at least one insulating separation structure 120 may be formed in at least one selected from among the first device region RX1 and the second device region RX2.

The plurality of gate lines GL include a pair of split gate lines, i.e., first and second split gate lines GL1 and GL2, that are spaced apart from each other with the insulating separation structure 120 therebetween. The first and second split gate lines GL1 and GL2 are aligned with the insulating separation structure 120 in the height direction (e.g., the Y direction) of the logic cell LC.

The insulating separation structure 120 may include side walls 120S facing the first and second split gate lines GL1 and GL2, and the side walls 120S may contact the first and second split gate lines GL1 and GL2 and the gate dielectric films 118.

A pair of source/drain regions 172 may be respectively located at both sides of the insulating separation structure 120 with the insulating separation structure 120 therebetween, and the pair of source/drain regions 172 may be connected to each other through one jumper contact 130.

It will be understood that when an element or layer is referred to as being "connected to," or "coupled to" another element or layer, it can be directly connected to or coupled to another element or layer or intervening elements or layers may be present. In contrast, when an element is referred to as being "directly connected to," "directly coupled to" or "directly physically connected to" another element or layer, there are no intervening elements or layers present. The term "contacting" refers to a direct connection (i.e., touching), unless the context indicates otherwise.

A first gate line of in a first gate structure GS may be located between a first source/drain region 172 and one of the pair of source/drain regions 172 in the first direction. A second gate line in a second gate structure GS may be located between a second source/drain region 172 and the other one of the pair of source/drain regions 172 in the first direction. Each of the first and second gate lines may include a conductive layer.

In example embodiments, a level of a top surface of the insulating separation structure 120 may be higher than a level of a top surface of each of the first and second gate lines and may be lower than a level of a top surface of the gate insulating capping layer 180 of each of the first and second gate structures GS.

In example embodiments, a portion of the insulating separation structure 120 may be located at the same vertical level as the conductive layer of the first and second gate lines.

The jumper contact 130 may include a pair of vertical extensions 132 respectively connected to the pair of source/drain regions 172, and a horizontal extension 134 integrally connected to the pair of vertical extensions 132, located over the insulating separation structure 120, and extending in a direction parallel to the fin-type active regions FA to cover the insulating separation structure 120. The horizontal extension 134 may vertically overlap the insulating separation structure 120. The horizontal extension 134 may not vertically overlap the first and second split gate lines GL1 and GL2. The pair of source/drain regions 172 may be connected to an upper conductive line (not shown) through the jumper contact 130.

A metal silicide film 128 may be formed on connected portions between the jumper contact 130 and the pair of source/drain regions 172. Also, the metal silicide film 128 may be formed on connected portions between the plurality of source/drain regions 172 and the plurality of source/drain contact plugs CA. The metal silicide film 128 may include Ti, W, Ru, Nb, Mo, Hf, Ni, Co, Pt, Yb, Tb, Dy, Er, or Pd. For example, the metal silicide film 128 may be formed of, but is not limited to, titanium silicide.

Side walls of the jumper contact 130, the plurality of source/drain contact plugs CA, and a plurality of gate contact plugs CB may be covered by an insulating liner 126. The insulating liner 126 may include a silicon nitride film.

Although the jumper contact 130 has a substantially rectangular planar shape in FIG. 1, the inventive concept is not limited thereto. For example, the jumper contact 130 may have any of various planar shapes, instead of a specific planar shape, as long as the jumper contact 130 located over the insulating separation structure 120 may extend to be connected to the pair of source/drain regions 172 located at both sides of the insulating separation structure 120.

Detailed modifications of a planar shape of the jumper contact 130 will be explained below with reference to FIGS. 7 through 9.

The insulating separation structure 120 may extend to be located inside and outside the second device region RX2. For example, the insulating separation structure 120 may include a portion located in the second device region RX2 and a portion located in the inter-device isolation region DTA. In the height direction (e.g., the Y direction) of the logic cell LC, a length of the jumper contact 130 may be less than a length of the insulating separation structure 120. For example, in the Y direction, a length between a first end and a second end of the jumper contact 130 is less than a length between a first end and a second end of the insulating separation structure 120. In this configuration, a sufficient distance between the jumper contact 130 and the first and second split gate lines GL1 and GL2 may be secured.

The first split gate line GL1 located in the first device region RX1 from among the first and second split gate lines GL1 and GL2 may function as a normal gate line. In contrast, the second split gate line GL2 located in the second device region RX2 may be a dummy gate line that does not perform a function of a normal gate line.

The plurality of gate contact plugs CB may be formed on the plurality of gate lines GL. The plurality of gate lines GL may be connected to an upper conductive line (not shown) through the plurality of gate contact plugs CB. The first split gate line GL1 that is one of the first and second split gate lines GL1 and GL2 may also be connected to the upper conductive line through the gate contact plug CB. For example, the second split gate line GL2 that is the remaining one of the first and second split gate lines GL1 and GL2 may not be connected to the upper conductive line.

A level of a top surface 130T of the jumper contact 130, a level of a top surface CAT of each of the plurality of source/drain contact plugs CA, and a level of a top surface CBT of each of the plurality of gate contact plugs CB may be substantially the same. Accordingly, a vertical distance from the main surface 110M of the substrate 110 to the top surface 130T of the jumper contact 130, a vertical distance from the main surface 110M of the substrate 110 to the top surface CAT of each of the plurality of source/drain contact plugs CA, and a vertical distance from the main surface 110M of the substrate 110 to the top surface CBT of each of the plurality of gate contact plugs CB may be substantially the same.

In example embodiments, in the X direction, a width of the top surface 130T of the jumper contact 130 may be greater than a width of the top surface CAT of each of the plurality of source/drain contact plugs CA. In other example embodiments, in the X direction, a width of the top surface 130T of the jumper contact 130 may be greater than a width of the top surface CB T of each of the plurality of gate contact plugs CB.

A fin separation trench T1 may be formed in a portion of the fin-type active region FA corresponding to a position of the insulating separation structure 120. The insulating separation structure 120 may include a buried separation portion 120A filling the fin separation trench T1, and a protruding separation portion 120B integrally connected to the buried separation portion 120A and extending away from the fin-type active region FA. The protruding separation portion 120B may protrude upward beyond a top surface FT of the fin-type active region FA. The protruding separation portion 120B may be located between the pair of vertical extensions 132 of the jumper contact 130.

A level LV1 of a lowermost surface of the insulating separation structure 120 may be higher than a level LV2 of the main surface 110M of the substrate 110 and may be lower than a level LV3 of the top surface FT of the fin-type active region FA. A level LV4 of an uppermost surface of the insulating separation structure 120 may be higher than a level LV5 of an uppermost surface of each of the gate lines GL and may be lower than a level LV6 of an uppermost surface of each of the gate insulating capping layers 180.

In example embodiments, in the Z direction, a length between the level LV1 of a lowermost surface of the insulating separation structure 120 and the level LV4 of an uppermost surface of the insulating separation structure 120 may be less than a length between the level LV3 of the top surface FT of the fin-type active region FA and the level of a top surface 130T of the jumper contact 130.

A top surface 120T of the protruding separation portion 120B may include a rounded convex surface. Both side walls of the protruding separation portion 120B may be covered by a pair of insulating spacers 162. The pair of insulating spacers 162 may be located between the protruding separation portion 120B and the vertical extensions 132. The top surface 120T of the protruding separation portion 120B and top surfaces of the pair of insulating spacers 162 may be smoothly connected to form one rounded convex surface. A bottom surface of the horizontal extension 134 that is a portion of the jumper contact 130 facing and contacting the top surface 120T of the insulating separation structure 120 may include a rounded concave surface corresponding to a profile of the rounded convex surface of the top surface 120T of the insulating separation structure 120.

A level of a bottom surface 120BT (see FIG. 2C) of the insulating separation structure 120 may be lower than a level of a bottom surface of each of the plurality of source/drain regions 172. Although the bottom surface 120BT of the insulating separation structure 120 is substantially flat in the Y direction in FIG. 2C, a profile of the bottom surface 120BT of the insulating separation structure 120 may be modified in various ways. Detailed modifications of a profile of the bottom surface 120BT of the insulating separation structure 120 will be explained below with reference to FIG. 3.

In some example embodiments, the insulating separation structure 120 may include a single insulating film, or a multi-layer structure including a plurality of insulating films. In other example embodiments, the insulating separation structure 120 may include an air gap. The term "air" as discussed herein, may refer to atmospheric air, or other gases that may be present during the manufacturing process. Examples of an insulating film included in the insulating separation structure 120 may include, but are not limited to, a silicon oxide film, a silicon nitride film, a SiOCN film, a SiCN film, and a combination thereof.

The jumper contact 130, the plurality of source/drain contact plugs CA, and the plurality of gate contact plugs CB may include the same conductive material. Each of the jumper contact 130, the plurality of source/drain contact plugs CA, and the plurality of gate contact plugs CB may include a buried metal film and a conductive barrier film surrounding the buried metal film. The buried metal film may be formed of cobalt (Co), copper (Cu), tungsten (W), ruthenium (Ru), manganese (Mn), or a combination thereof, and the conductive barrier film may be formed of Ti, Ta, TiN, TaN, or a combination thereof. In example embodiments, each of the jumper contact 130, the plurality of source/drain contact plugs CA, and the plurality of gate contact plugs CB may be the same material.

The jumper contact 130, the plurality of source drain contact plugs CA, and the plurality of gate contact plugs CB may be insulated from one another by the gate insulating capping layers 180, the plurality of insulating spacers 162, and the interlayer insulating film 190.

In the logic cell LC, a ground line VSS may be connected to the fin-type active regions FA in the first device region RX1 through the source/drain contact plugs CA, and a power line VDD may be connected to the fin-type active regions FA in the second device region RX2 through the source/drain contact plugs CA. The ground line VSS and the power line VDD may be formed at a level higher than that of a top surface of each of the jumper contact 130, the plurality of source/drain contact plugs CA, and the plurality of gate contact plugs CB. Each of the ground line VSS and the power line VDD may include a conductive barrier film and a wiring conductive layer. The conductive barrier film may be formed of Ti, Ta, TiN, TaN, or a combination thereof. The wiring conductive layer may be formed of Co, Cu, W, an alloy thereof, or a combination thereof.

Although the logic cell LC includes one insulating separation structure 120 and one jumper contact 130 in the integrated circuit device 100 in FIGS. 1 through 2D, the inventive concept is not limited thereto. For example, one logic cell LC may include a plurality of the insulating separation structures 120 and/or a plurality of the jumper contacts 130.

The integrated circuit device 100 of FIGS. 1 through 2D includes the insulating separation structure 120 located on the fin-type active regions FA in the logic cell LC and extending in a direction parallel to the plurality of gate lines GL and the jumper contact 130 located on the insulating separation structure 120 and vertically overlapping the insulating separation structure 120 to connect the pair of source/drain regions 172 located at both sides of the insulating separation structure 120 with the insulating separation structure 120 therebetween. The jumper contact 130 located over the insulating separation structure 120 may extend from the insulating separation structure 120 toward the pair of source/drain regions 172 so that the pair of source/drain regions 172 are electrically connected to each other. When the pair of source/drain regions 172 are connected to each other by using the jumper contact 130, since the jumper contact 130 passes over the insulating separation structure 120, without passing over the gate lines GL formed of a conductive material, the risk of a short circuit between the jumper contact 130 and the gate lines GL may be prevented.

In an integrated circuit device not including the insulating separation structure 120 according to a comparative example, the jumper contact 130 has to pass over one gate line GL in order to connect the pair of source/drain regions 172 formed at both sides of the gate line GL. In this case, the possibility that a short circuit occurs between the jumper contact 130 and the gate line GL located under the jumper contact 130 while the jumper contact 130 is formed may be high. Also, in order to use, as a normal gate line, the gate line GL passing between the pair of source/drain regions 172 in the first device region RX1 where the jumper contact 130 is not formed from among the first device region RX1 and the second device region RX2, a process of cutting the gate line GL passing between the pair of source/drain regions 172 in the inter device isolation region DTA has to be performed. Accordingly, a process of manufacturing the integrated circuit device may be complicated and the inter-device isolation region DTA may need to have a relatively large area. However, there is a limitation in increasing an area of the inter-device isolation region DTA as the integrated circuit device is highly integrated, and when the number of wirings and contacts formed at the same level is increased as the integrated circuit device is highly integrated, it may be difficult to stably secure an insulating distance between the contacts in a fixed area of the inter-device isolation region DTA.

In contrast, according to example embodiments of the present disclosure, since the insulating separation structure 120 is formed on the fin-type active regions FA in the second device region RX2 where the jumper contact 130 is located to extend in a direction parallel to the plurality of gate lines GL, when the pair of source/drain regions 172 are to be connected to each other by using the jumper contact 130, the jumper contact 130 may pass over the insulating separation structure 120, instead of the gate lines GL. Accordingly, a short circuit between the jumper contact 130 and the gate lines GL located under the jumper contact 130 may be prevented. Also, the first split gate line GL1 located in the first device region RX1 from among the first and second split gate lines GL1 and GL2 aligned with the insulating separation structure 120 from among the plurality of gate lines GL may be used as a normal gate line without undergoing an additional gate cutting process. Accordingly, an additional process for cutting the gate lines GL passing between the pair of source/drain regions 172 in the inter-device isolation region DTA may be omitted, and an additional space for cutting the gate lines GL in the inter-device isolation region DTA may not need to be secured. Accordingly, an area of the inter-device isolation region DTA may be reduced, thereby reducing a size of the logic cell LC.

Figure 3:
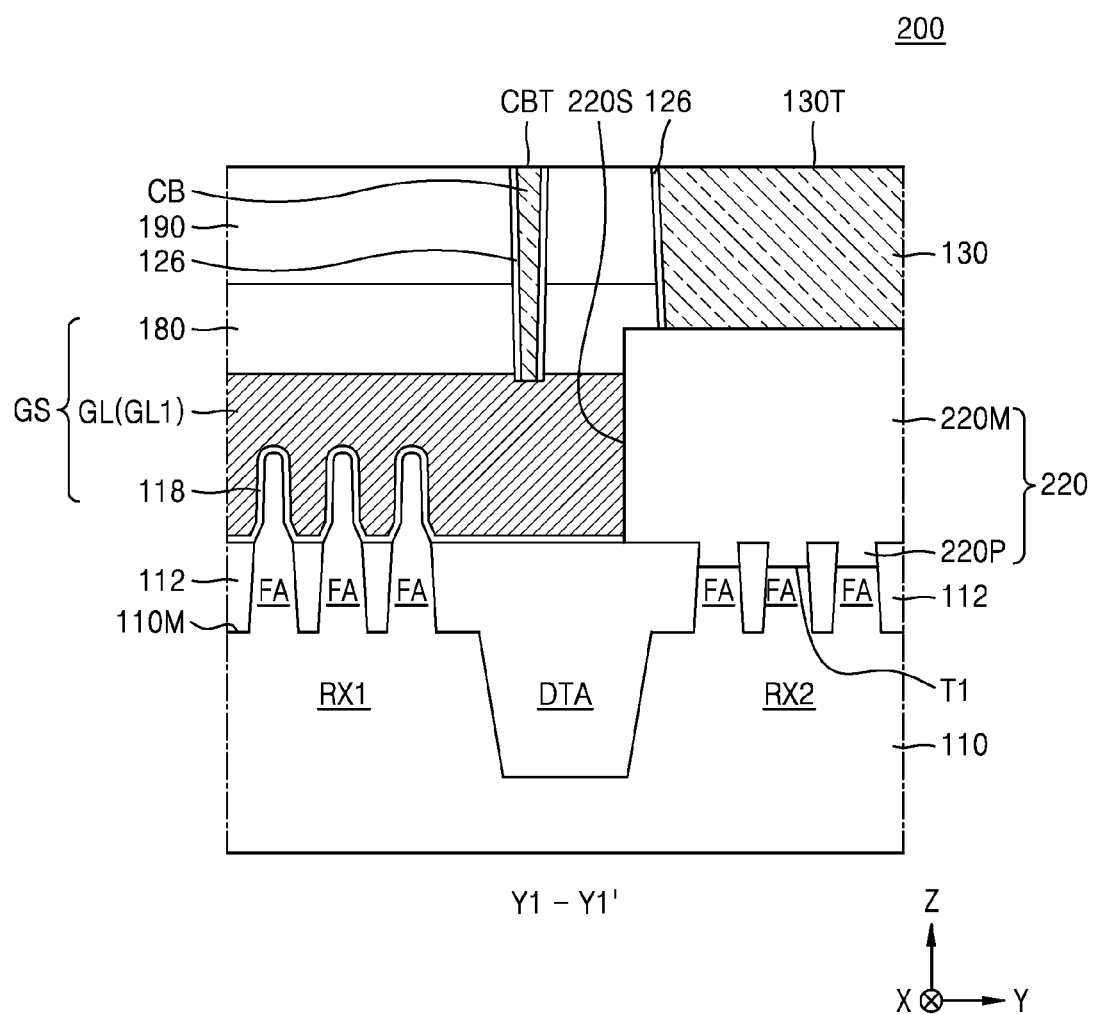
FIG. 3 is a cross-sectional view for explaining an integrated circuit device according to example embodiments.

FIG. 3 is a cross-sectional view for explaining an integrated circuit device 200 according to example embodiments.

The integrated circuit device 200 of FIG. 3 may have substantially the same configuration as that of the integrated circuit device 100 of FIGS. 2A through 2D. In an example embodiment, in the integrated circuit device 200, an insulating separation structure 220 includes a main separation portion 220M extending to be aligned with the first split gate line GL1, and at least one protruding separation portion 220P protruding from the main separation portion 220M toward the substrate 110. In FIG. 3, a plurality of the protruding separation portions 220P filling the fin separation trench T1 are formed on the fin-type active regions FA. The protruding separation portions 220P may be integrally connected to the main separation portion 220M at positions corresponding to the fin-type active regions FA. A height of a top surface of the device isolation film 112 that is located around each of the protruding separation portions 220P and contacts a bottom surface of the insulating separation structure 220 is greater than a height of a bottom surface of the fin separation trench T1. The bottom surface of the insulating separation structure 220 may have an uneven profile due to the protruding separation portions 220P that protrude from the main separation portion 220M toward the substrate 110.

The number of the protruding separation portions 220P included in the insulating separation structure 220 may correspond to the number of the fin-type active regions FA that intersect the insulating separation structure 220. Although the insulating separation structure 220 extends to intersect three fin-type protruding separation portions FA and thus the insulating separation structure 220 includes three protruding separation portions 220P in FIG. 3, the inventive concept is not limited thereto. For example, the insulating separation structure 220 may include one protruding separation portion 220P, or four or more protruding separation portions 220P.

The insulating separation structure 220 includes side walls 220S facing the first and second split gate lines GL1 and GL2. The side walls 220S of the insulating separation structure 220 may contact the first and second split gate lines GL1 and GL2 and the gate dielectric films 118.

Figure 4A:
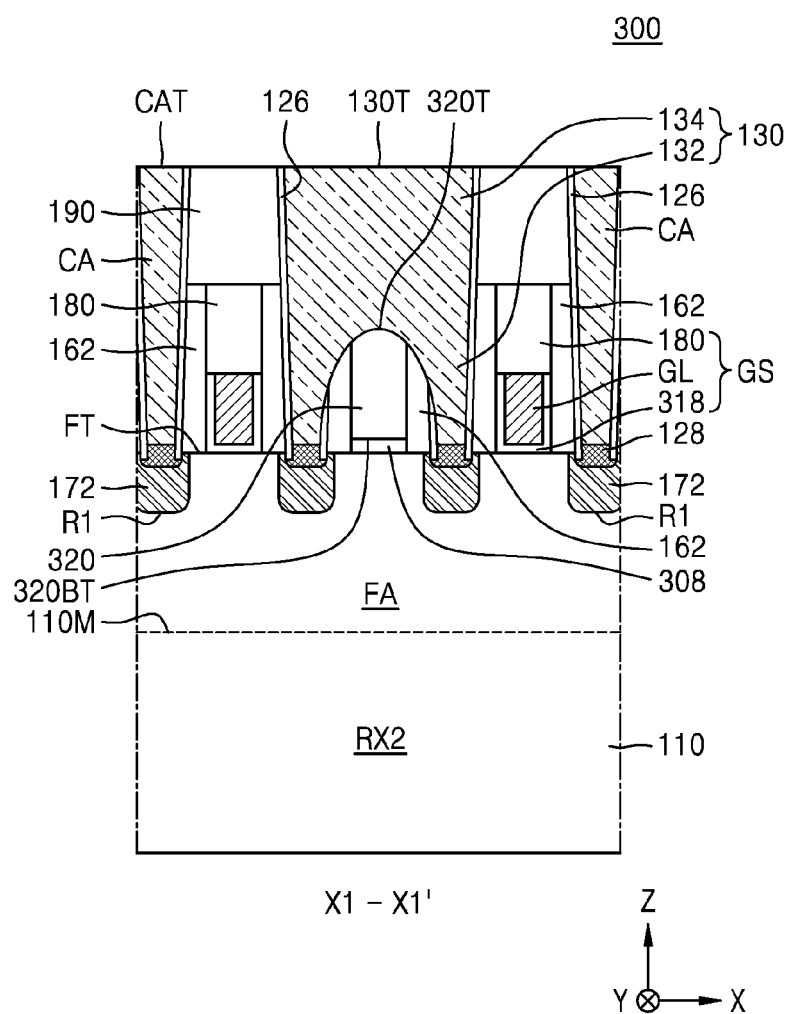
FIGS. 4A and 4B are cross-sectional views for explaining an integrated circuit device according to example embodiments.
Figure 4B:
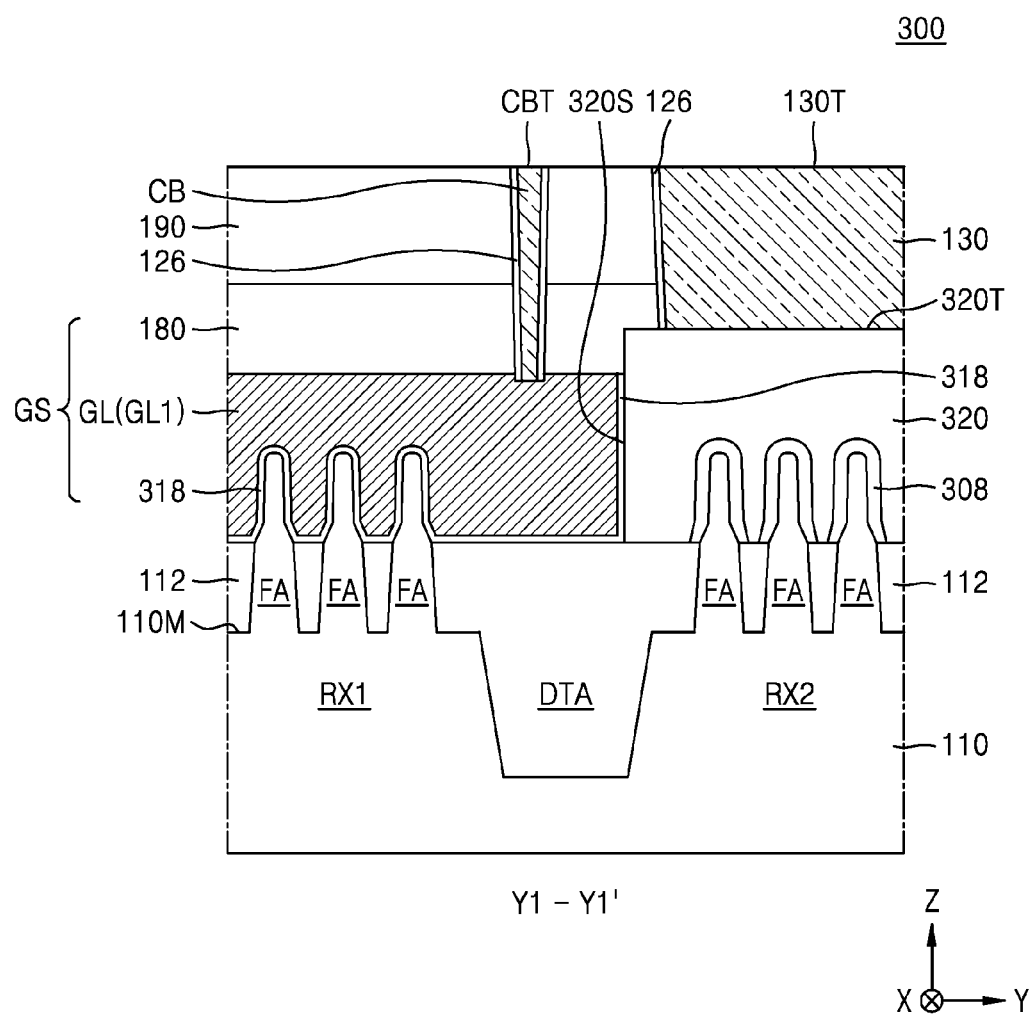

FIGS. 4A and 4B are views for explaining an integrated circuit device 300 according to example embodiments. FIG. 4A is a cross-sectional view taken along line X1-X1' of FIG. 1. FIG. 4B is a cross-sectional view taken along line Y1-Y1' of FIG. 1. In some example embodiments, the integrated circuit device 300 of FIGS. 4A and 4B may have the same planar layout as that of the integrated circuit device 100 of FIG. 1.

The integrated circuit device 300 of FIGS. 4A and 4B may have substantially the same configuration as that of the integrated circuit device 100 of FIGS. 2A through 2D. In an example embodiment, in the integrated circuit device 300, the fin separation trench T1 is not formed in the fin-type active regions FA from among the plurality of fin-type active regions FA that intersects an insulating separation structure 320, unlike in FIGS. 2A and 2C. The insulating separation structure 320 may cover upper side walls and a top surface of the fin-type active region FA. The insulating separation structure 320 may have a bottom surface 320BT facing the fin-type active region FA and the device isolation film 112, and a top surface 320T facing and contacting the jumper contact 130. A level of the bottom surface 320BT of the insulating separation structure 320 may be higher than a level of a bottom surface of each of the plurality of source/drain regions 172. The bottom surface 320BT of the insulating separation structure 320 may be spaced apart from the fin-type active region FA with a dummy gate dielectric film 308 therebetween. The dummy gate dielectric film 308 may include a silicon oxide film.

As shown in FIG. 4A, the top surface 320T of the insulating separation structure 320 may include a rounded convex surface. Both side walls of the insulating separation structure 320 may be covered by a pair of insulating spacers 162. The pair of insulating spacers 162 may be located between the insulating separation structure 320 and the vertical extensions 132. The top surface 320T of the insulating separation structure 320 and top surfaces of the pair of insulating spacers 162 may be smoothly connected to form one rounded convex surface.

A bottom surface of the horizontal extension 134 of the jumper contact 130 that contacts the top surface 320T of the insulating separation structure 320 may include a rounded concave surface corresponding to a profile of the rounded convex surface of the top surface 320T of the insulating separation structure 320.

A gate dielectric film 318 located between the fin-type active region FA and the first split gate line GL1 in the first device region RX1 may extend to a space between the first split gate line GL1 and the insulating separation structure 320. Side walls 320S of the insulating separation structure 320 may contact the gate dielectric film 318. The insulating separation structure 320 may be spaced apart from the first and second split gate lines GL1 and GL2 with the gate dielectric film 318 therebetween. Detailed configurations of the gate dielectric film 318 and the insulating separation structure 320 are substantially the same as those of the gate dielectric film 118 and the insulating separation structure 120 described with reference to FIGS. 2A through 2D.

Figure 5A:
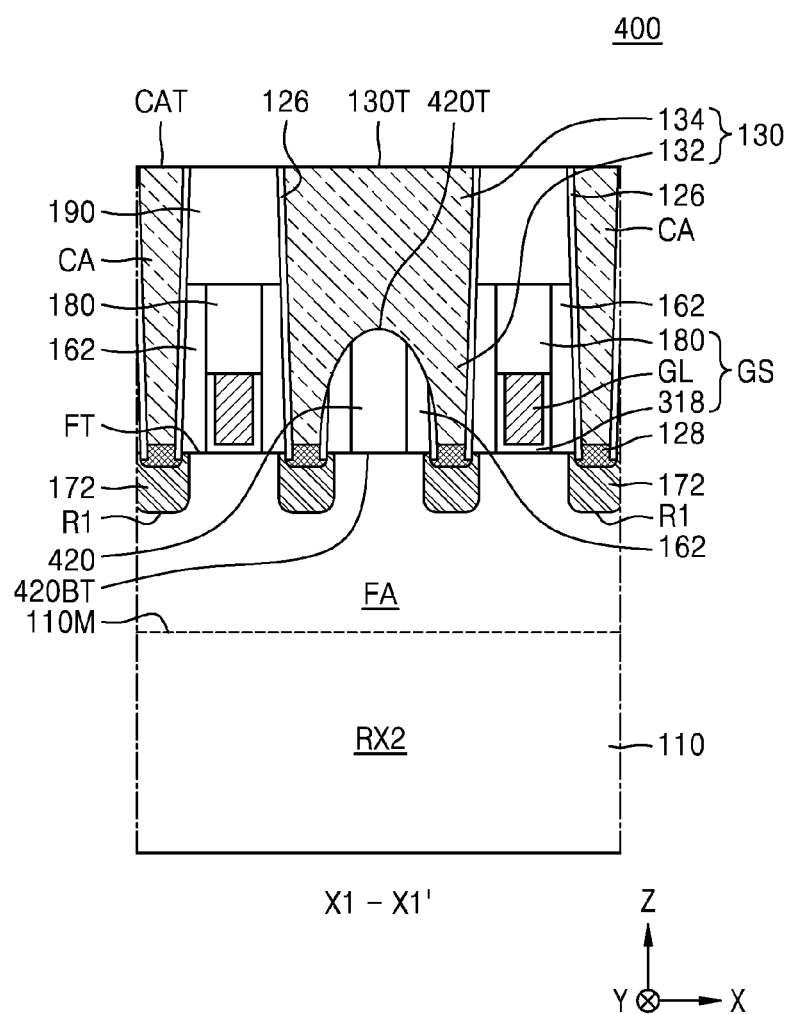
FIGS. 5A and 5B are cross-sectional views for explaining an integrated circuit device according to example embodiments.
Figure 5B:
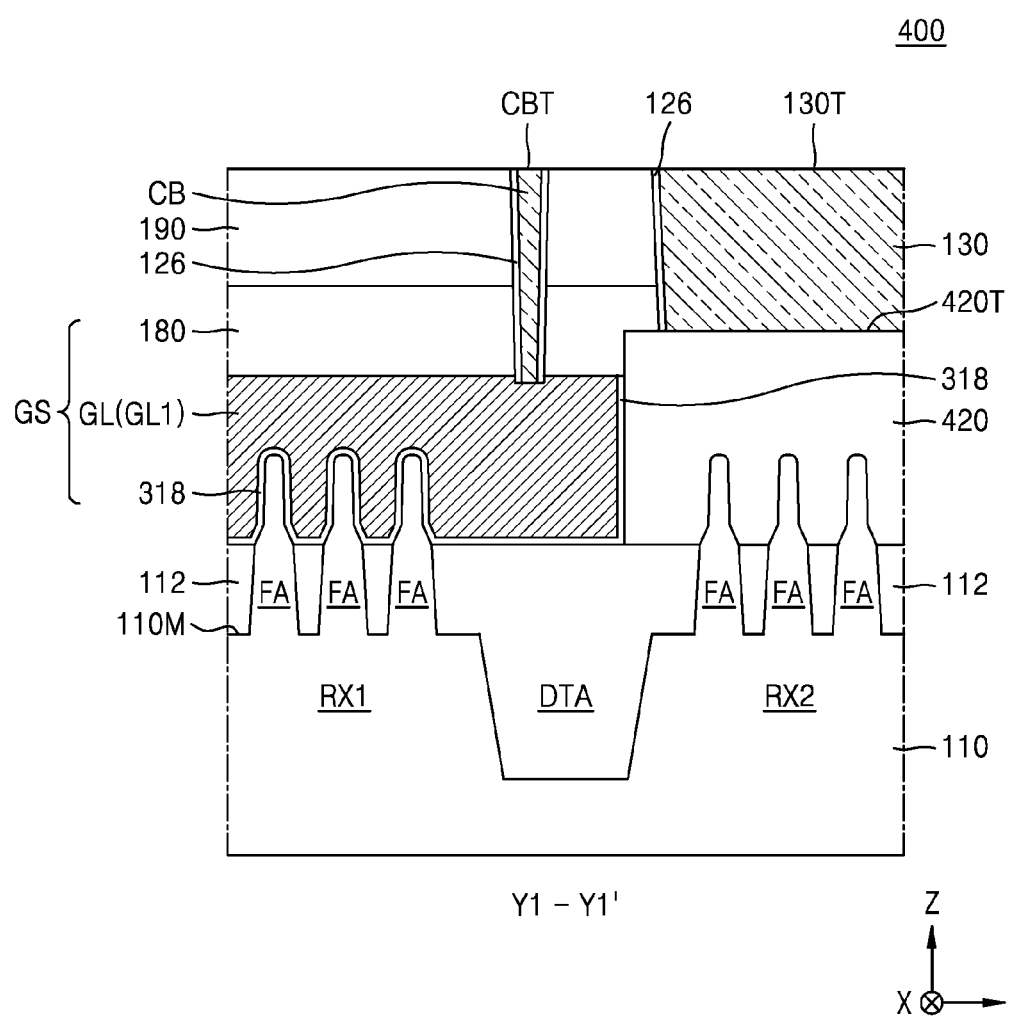

FIGS. 5A and 5B are views for explaining an integrated circuit device 400 according to example embodiments. FIG. 5A is a cross-sectional view taken along line X1-X1' of FIG. 1. FIG. 5B is a cross-sectional view taken along line Y1-Y1' of FIG. 1. In some embodiments, the integrated circuit device 400 of FIGS. 5A and 5B may have the same planar layout as that of the integrated circuit device 100 of FIG. 1.

The integrated circuit device 400 of FIGS. 5A and 5B may have substantially the same configuration as that of the integrated circuit device 300 of FIGS. 4A and 4B. In an example embodiment, the integrated circuit device 400 does not include the dummy gate dielectric film 308 of FIGS. 4A and 4B. An insulating separation structure 420 may have a bottom surface 420BT facing and contacting the fin-type active region FA and a top surface 420T facing and contacting the jumper contact 130. The insulating separation structure 420 may contact upper side walls and a top surface of the fin-type active region FA of the plurality of fin-type active regions FA that intersects the insulating separation structure 420.

The top surface 420T of the insulating separation structure 420 may include a rounded convex surface. Both side walls of the insulating separation structure 420 may be covered by a pair of insulating spacers 162. The pair of insulating spacers 162 may be located between the insulating separation structure 420 and the vertical extensions 132. The top surface 420T of the insulating separation structure 420 and top surfaces of the pair of insulating spacers 162 may be smoothly connected to form one rounded convex surface. A bottom surface of the horizontal extension 134 of the jumper contact 130 that contacts the top surface 420T of the insulating separation structure 420 may include a rounded concave surface corresponding to a profile of the rounded convex surface of the top surface 420T of the insulating separation structure 420. A detailed configuration of the insulating separation structure 420 is substantially the same as that of the insulating separation structure 120 described with reference to FIGS. 2A through 2D.

Although configurations of the integrated circuit devices 100, 200, 300, and 400 have been explained with reference to FIGS. 1, 2A-2D, 3, 4A, 4B, 5A, and 5B, the inventive concept is not limited thereto and various modifications and changes may be made from the configurations of FIGS. 1, 2A-2D, 3, 4A, 4B, 5A, and 5B within the scope of the inventive concept.

Figure 6A:
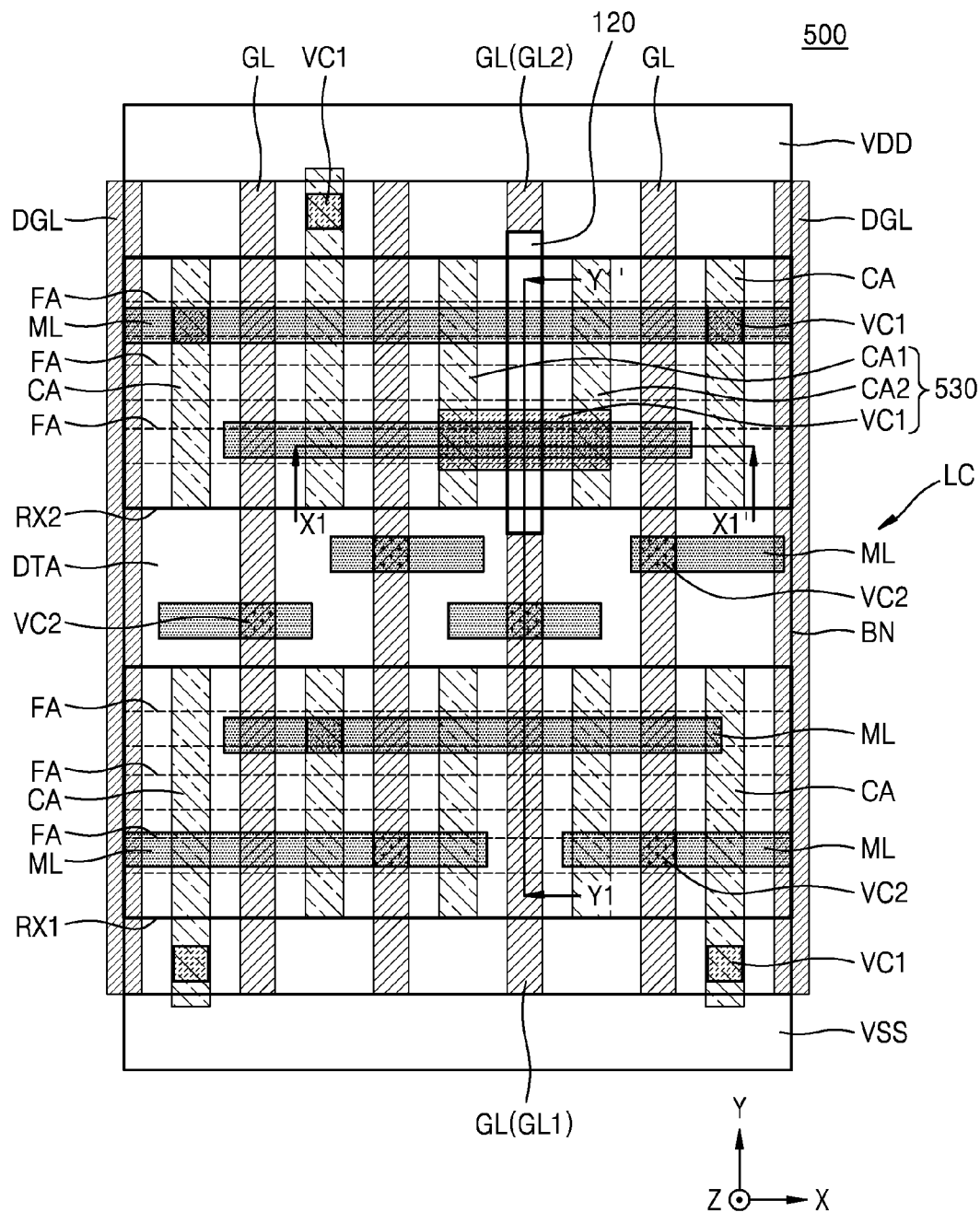
FIG. 6A is a planar layout diagram for explaining an integrated circuit device according to example embodiments.
Figure 6B:
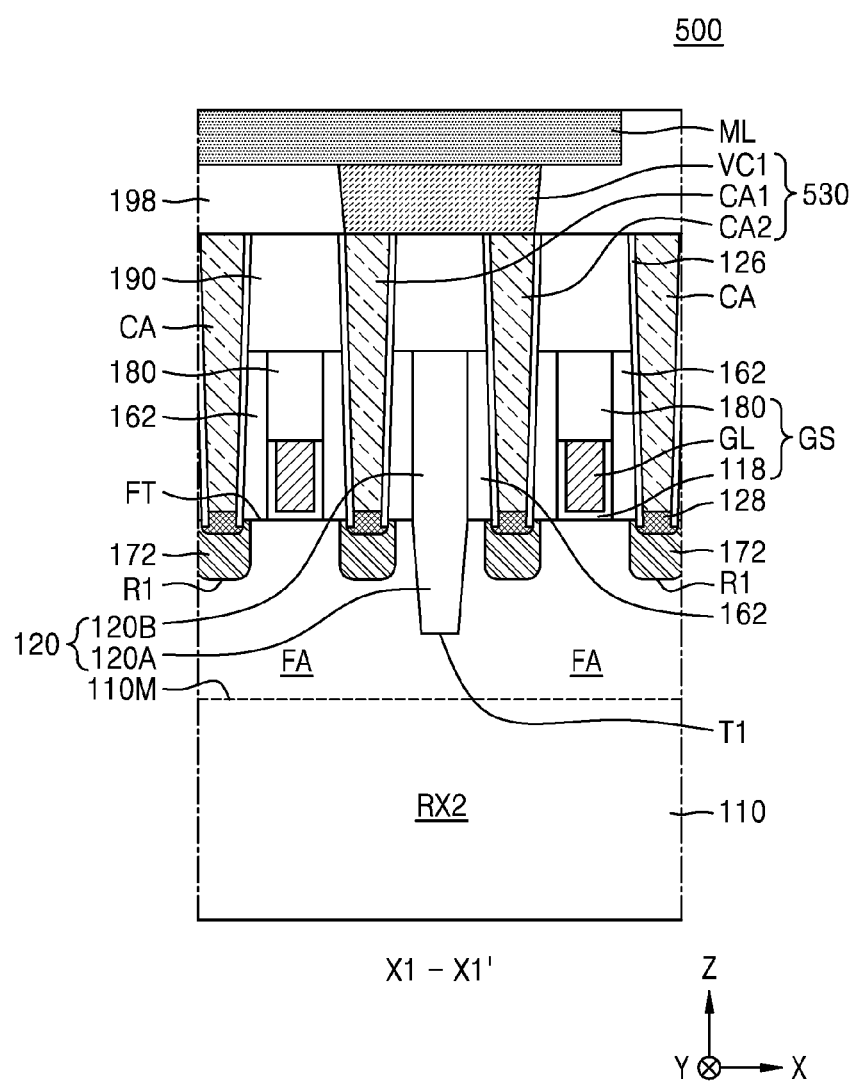
FIG. 6B is a cross-sectional view taken along line X1-X1' of FIG. 6A according to example embodiments.
Figure 6C:
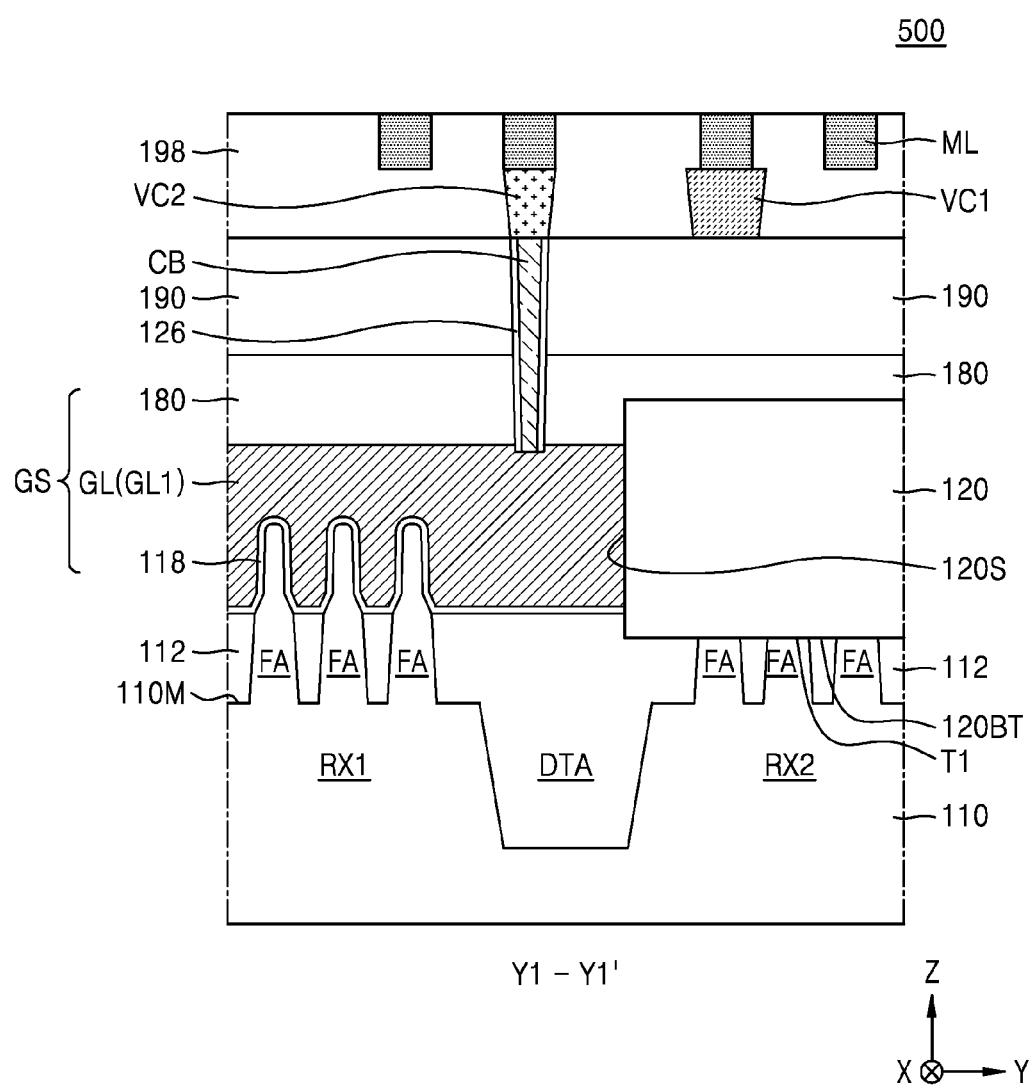
FIG. 6C is a cross-sectional view taken along line Y1-Y1' of FIG. 6A according to example embodiments.

FIG. 6A is a planar layout diagram for explaining an integrated circuit device 500 according to example embodiments. FIG. 6B is a cross-sectional view taken along line X1-X1' of FIG. 6A according to example embodiments. FIG. 6C is a cross-sectional view taken along line Y1-Y1' of FIG. 6A according to example embodiments.

Referring to FIGS. 6A through 6C, the integrated circuit device 500 has substantially the same configuration as that of the integrated circuit device 100 of FIG. 1. In an example embodiment, the integrated circuit device 500 includes a jumper contact 530 having a structure different from that of the jumper contact 130 in which a pair of vertical extensions 132 and the horizontal extension 134 are integrally connected. For example, the jumper contact 530 includes a pair of source/drain contact plugs CA1 and CA2 respectively connected to a pair of source/drain regions 172 located at both sides of the insulating separation structure 120 with the insulating separation structure 120 therebetween, and a first via contact plug VC1 located over the insulating separation structure 120 and connected between the pair of source/drain contact plugs CA1 and CA2. The pair of source/drain contact plugs CA1 and CA2 and the first via contact plug VC1 may be formed by using different processes.

The integrated circuit device 500 includes a plurality of conductive lines ML located over the plurality of gate lines GL and extending in a direction that intersects the plurality of gate lines GL.

A plurality of the first via contact plugs VC1 may be formed between the plurality of source/drain regions 172 and the plurality of conductive lines ML. Some of the plurality of source/drain regions 172 may be connected to any one conductive line ML selected from among the plurality of conductive lines ML through the source/drain contact plugs CA and the first via contact plugs VC1. A pair of source/drain regions 172 located at both sides of the insulating separation structure 120 with the insulating separation structure 120 therebetween may be connected to any one conductive line ML selected from among the plurality of conductive lines ML through the jumper contact 530 including a pair of source/drain contact plugs CA1 and CA2 and the first via contact plugs VC1 connected to the pair of source/drain contact plugs CA1 and CA2. The pair of source/drain contact plugs CA1 and CA2 may have configurations equal or similar to those of other source/drain contact plugs CA.

Some first via contact plugs VC1 from among the plurality of first via contact plugs VC1 may connect the source/drain contact plugs CA and the conductive lines ML. Other first via contact plugs VC1 from among the plurality of first via contact plugs VC1 may constitute the jumper contact 530. The first via contact plugs VC1 constituting the jumper contact 530 from among the first via contact plugs VC1 may each have a length in the X direction greater than that of each of other first via contact plugs VC1.

A plurality of second via contact plugs VC2 are formed between the plurality of gate lines GL and the plurality of conductive lines ML. The plurality of gate lines GL may each be connected to any one conductive line ML selected from among the plurality of conductive lines ML through the gate contact plugs CB and the second via contact plugs VC2. In order to connect the first split gate line GL1 and one conductive line ML selected from among the plurality of conductive lines ML, the gate contact plugs CB and the second via contact plugs VC2 may be sequentially stacked between the first split gate line GL1 and the selected one conductive line ML.

The plurality of conductive lines ML may be formed at the same level as that of the ground line VSS and the power line VDD. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes. The plurality of conductive lines ML may be a plurality of unidirectional wiring layers that extend in the width direction (e.g., the X direction) of the logic cell LC to be parallel to one another. The plurality of conductive lines ML, the plurality of first via contact plugs VC1, and the plurality of second via contact plugs VC2 may be insulated from other adjacent conductors due to an interlayer insulating film 198. Each of the plurality of conductive lines ML, and the plurality of first via contact plugs VC1 and the plurality of second via contact plugs VC2 located under the plurality of conductive lines ML may include a conductive barrier film and a wiring conductive layer. The conductive barrier film may be formed of Ti, Ta, TiN, TaN, or a combination thereof. The wiring conductive layer may be formed of Co, Cu, W, an alloy thereof, or a combination thereof.

Although the jumper contact 530 includes the pair of source/drain contact plugs CA1 and CA2 and the first via contact plug VC1 in FIGS. 6A through 6C, the inventive concept is not limited thereto. For example, in order to form the jumper contact 530, any one conductive line ML selected from among the plurality of conductive lines ML may be used instead of the first via contact plug VC1. For example, a jumper contact, similar to the jumper contact 530, may be formed by connecting the selected conductive line ML to the pair of source/drain contact plugs CA1 and CA2 respectively connected to the pair of source/drain regions 172 with the insulating separation structure 120 therebetween.

Figure 7:
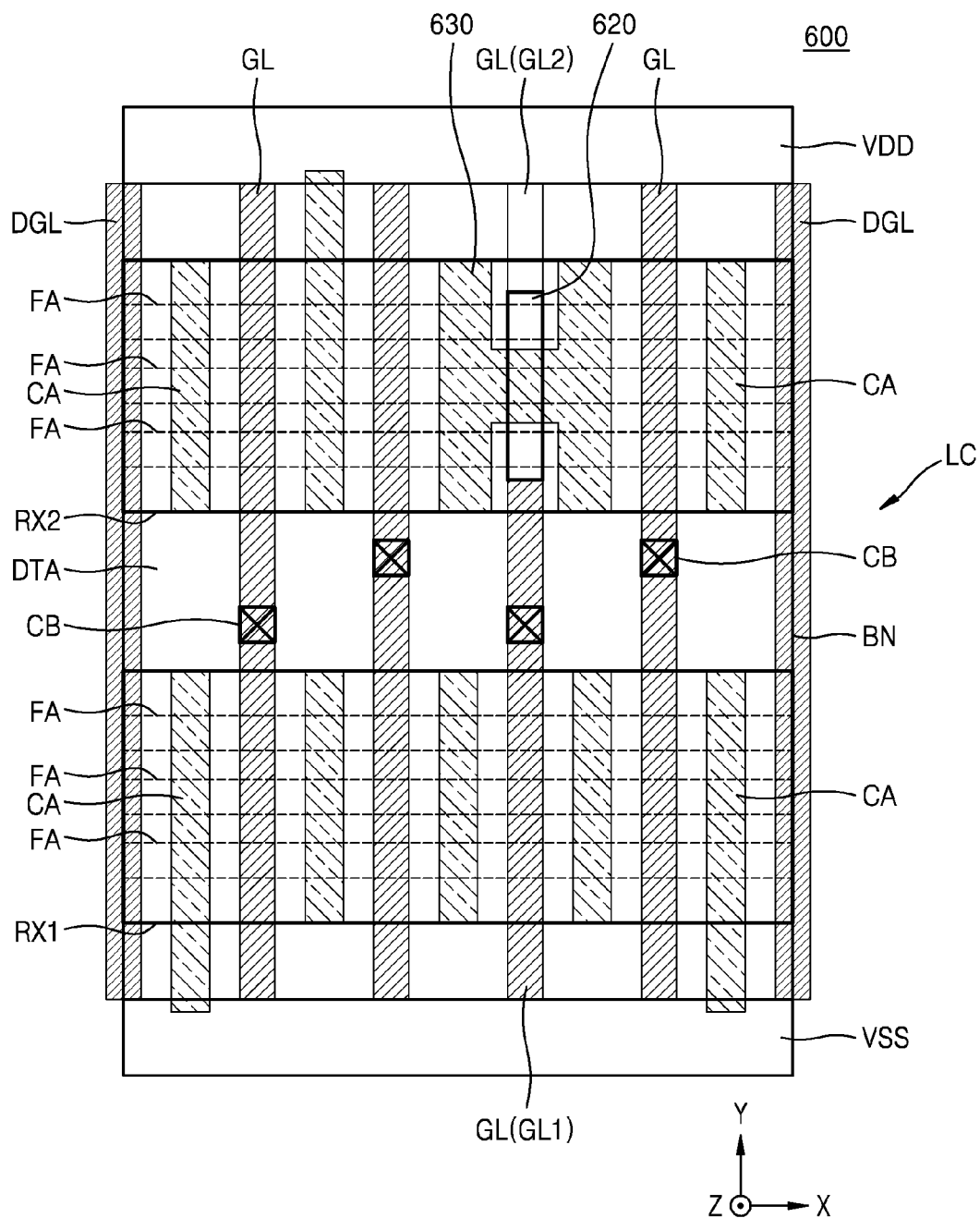
FIGS. 7 through 9 are planar layout diagrams for explaining integrated circuit devices according to example embodiments.
Figure 8:
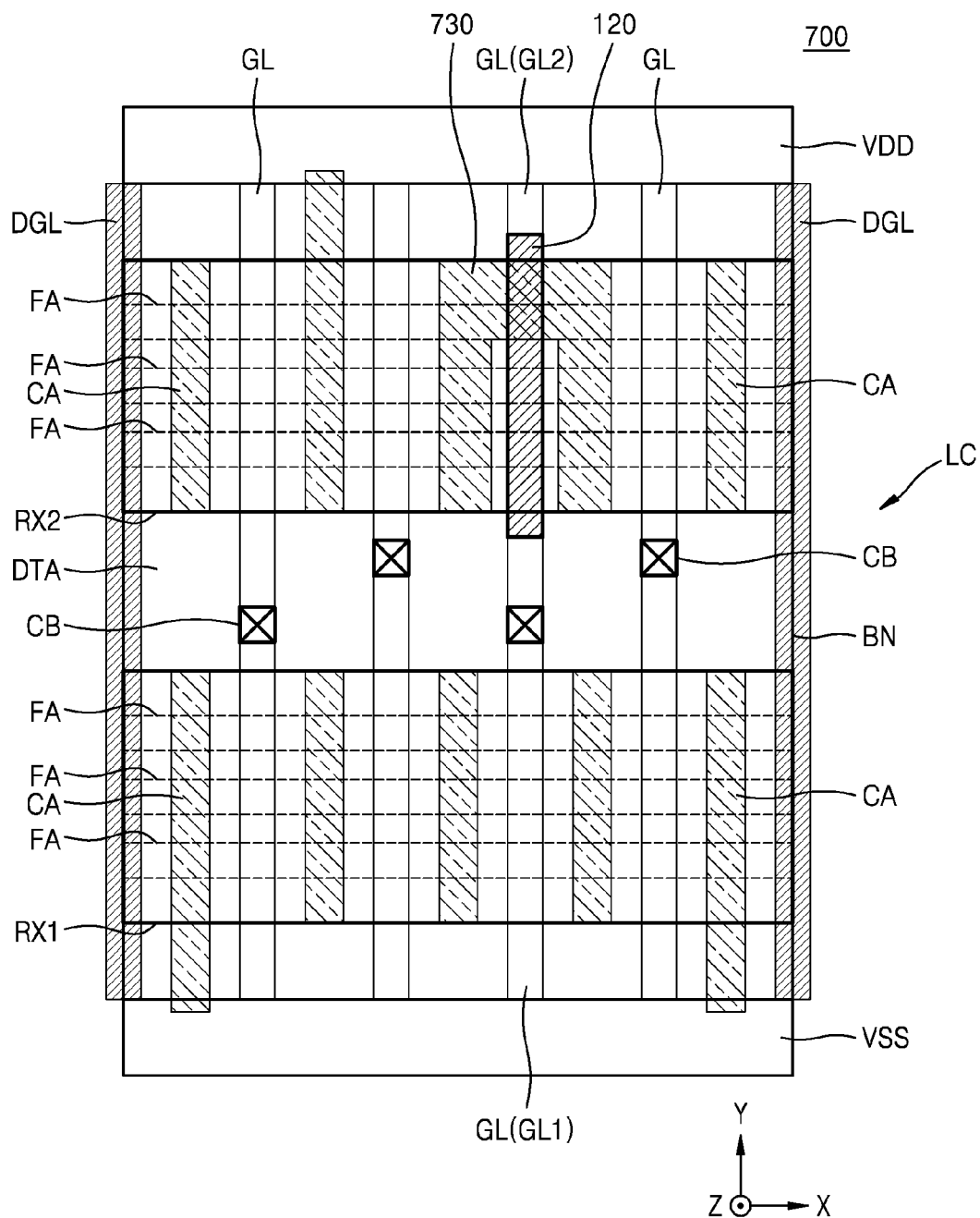
Figure 9:
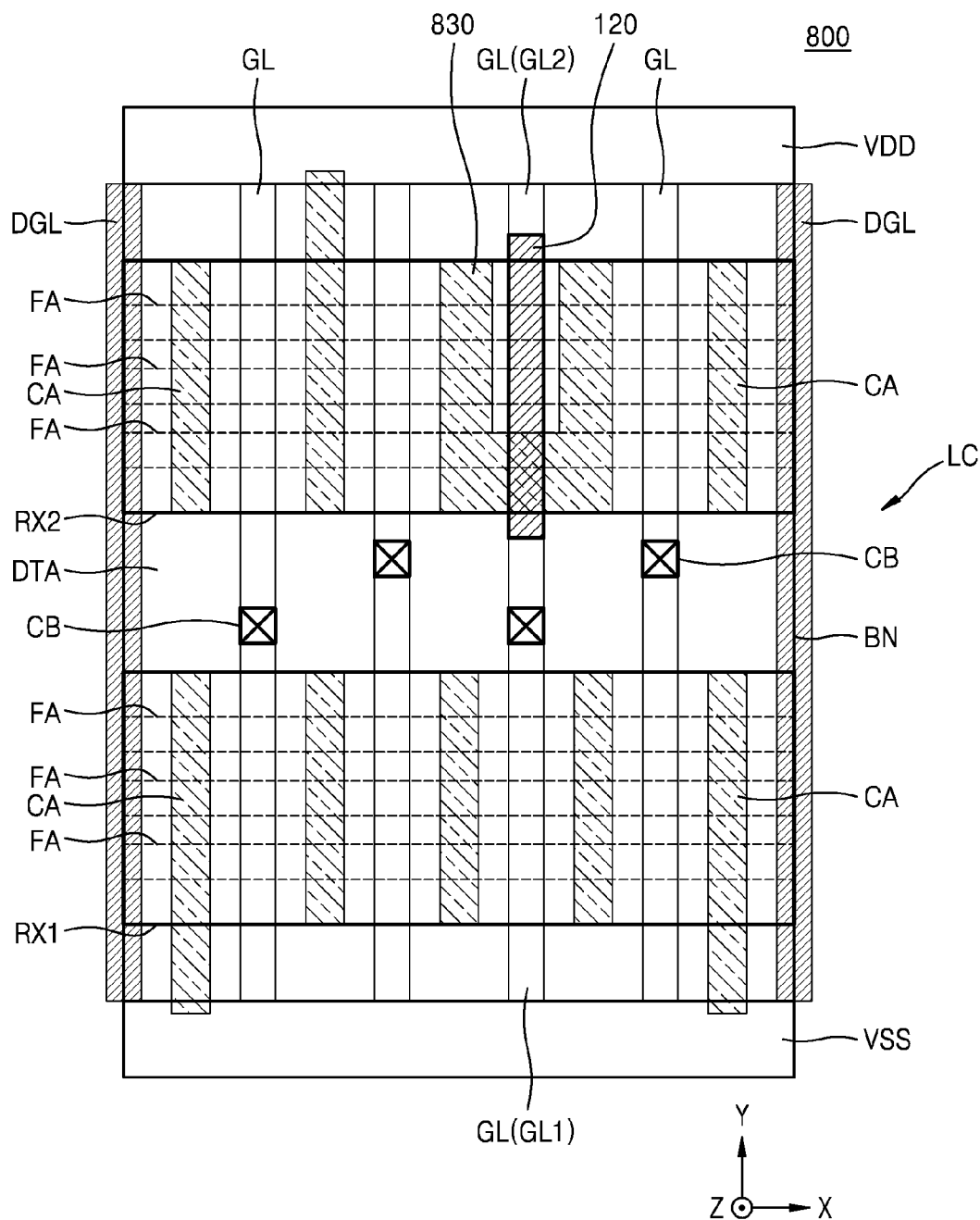

FIGS. 7 through 9 are planar layout diagrams for explaining integrated circuit devices according to example embodiments.

An integrated circuit device 600 of FIG. 7 has substantially the same configuration as that of the integrated circuit device 100 of FIG. 1. In an example embodiment, the integrated circuit device 600 includes a jumper contact 630 having a substantially "H" planar shape.

An insulating separation structure 620 located under the jumper contact 630 to vertically overlap the jumper contact 630 may be located not to extend beyond the second device region RX2. In the height direction (e.g., the Y direction) of the logic cell LC, a length of the portion of the jumper contact 630 located where the jumper contact 630 does not vertically overlap with the insulating separation structure 620 may be greater than a length of the insulating separation structure 620. However, a length of a portion of the jumper contact 630 located over the insulating separation structure 620 is less than the length of the insulating separation structure 620.

An integrated circuit device 700 of FIG. 8 has substantially the same configuration as that of the integrated circuit device 100 of FIG. 1. In an example embodiment, the integrated circuit device 700 includes a jumper contact 730 having a substantially "∩" (e.g., n-shaped) planar shape. In the height direction (e.g., the Y direction) of the logic cell LC, a length of a portion of the jumper contact 730 located over the insulating separation structure 120 and a length of the portion of the jumper contact 730 located where the jumper contact 730 does not vertically overlap with the insulating separation structure 120 may be less than a length of the insulating separation structure 120.

An integrated circuit device 800 of FIG. 9 has substantially the same configuration as that of the integrated circuit device 100 of FIG. 1. In an example embodiment, the integrated circuit device 800 includes a jumper contact 830 having a substantially "U" (e.g., u-shaped) planar shape. In the height direction (e.g., the Y direction) of the logic cell LC, a length of a portion of the jumper contact 830 located over the insulating separation structure 120 and a length of the portion of the jumper contact 830 located where the jumper contact 830 does not vertically overlap with the insulating separation structure 120 may be less than a length of the insulating separation structure 120.

Detailed configurations of the insulating separation structure 620 and the jumper contacts 630, 730, and 830 of FIGS. 7 through 9 are substantially the same as those of the insulating separation structure 120 and the jumper contact 130 described with reference to FIGS. 2A through 2D.

The integrated circuit devices 100, 200, 300, 400, 500, 600, 700, and 800 of FIGS. 1 through 9 include the jumper contacts 130, 530, 630, 730, and 830 located on the fin-type active regions FA, and the insulating separation structures 120, 220, 320, 420, and 620 extending in a direction parallel to the gate lines GL are located between the fin-type active regions FA and the jumper contacts 130, 530, 630, 730, and 830. The jumper contacts 130, 530, 630, 730, and 830 pass over the insulating separation structures 120, 220, 320, 420, and 620, instead of the gate lines GL, and connect to pair of source/drain regions 172 formed on the fin-type active regions FA. Accordingly, a short circuit between the jumper contacts 130, 530, 630, 730, and 830 and the gate lines GL may be prevented. Also, one of the first and second split gate lines GL1 and GL2 may be used as a normal gate line without performing an additional process for cutting the gate line GL extending between the pair of source/drain regions 172 connected to each other through the jumper contacts 130, 530, 630, 730, and 830. Accordingly, since an additional space for the process of cutting the gate line GL in the inter-device isolation region DTA may not need to be secured, an area of the inter-device isolation region DTA may be reduced. Even when the number of wiring sand contacts formed at the same level in the integrated circuit device having a device region with a reduced area according to downscaling is increased, an area of the inter-device isolation region DTA may be reduced, a size of the logic cell LC may be reduced, and an insulating distance between the contacts in the logic cell LC may be stably secured.

Figure 10A:
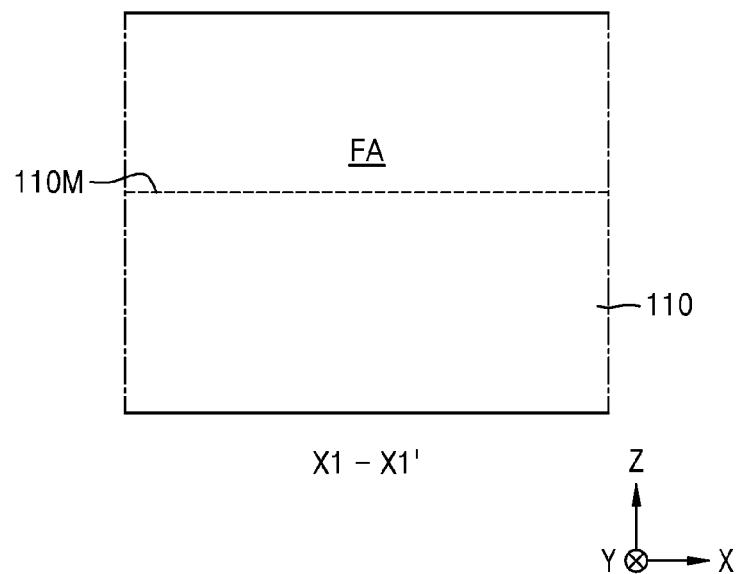
FIGS. 10A through 10O are cross-sectional views for explaining a method of manufacturing an integrated circuit device according to a process order according to example embodiments.
Figure 10B:
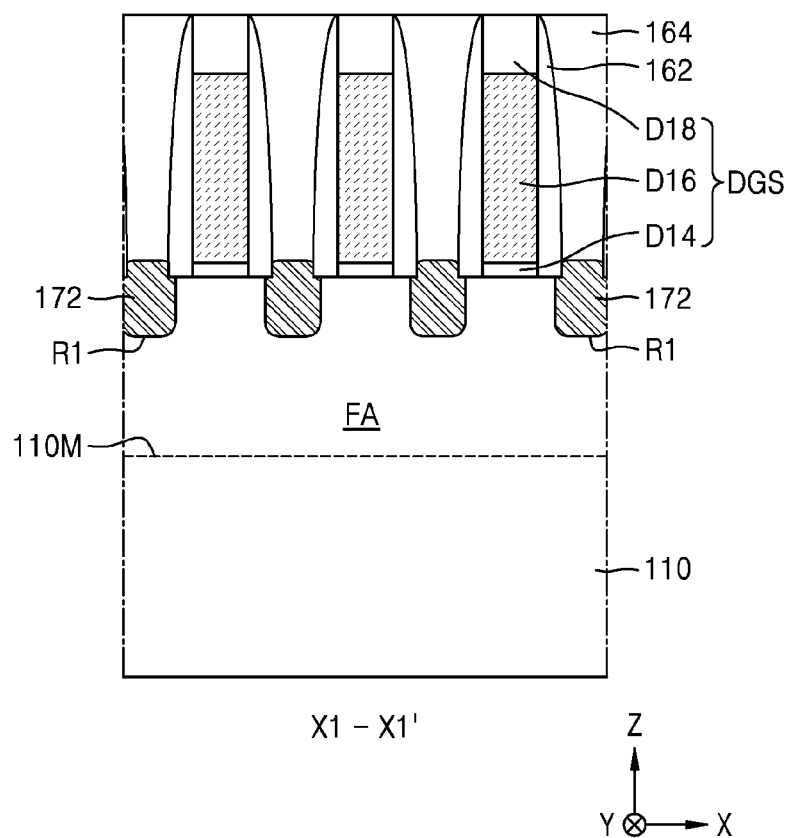
Figure 10C:
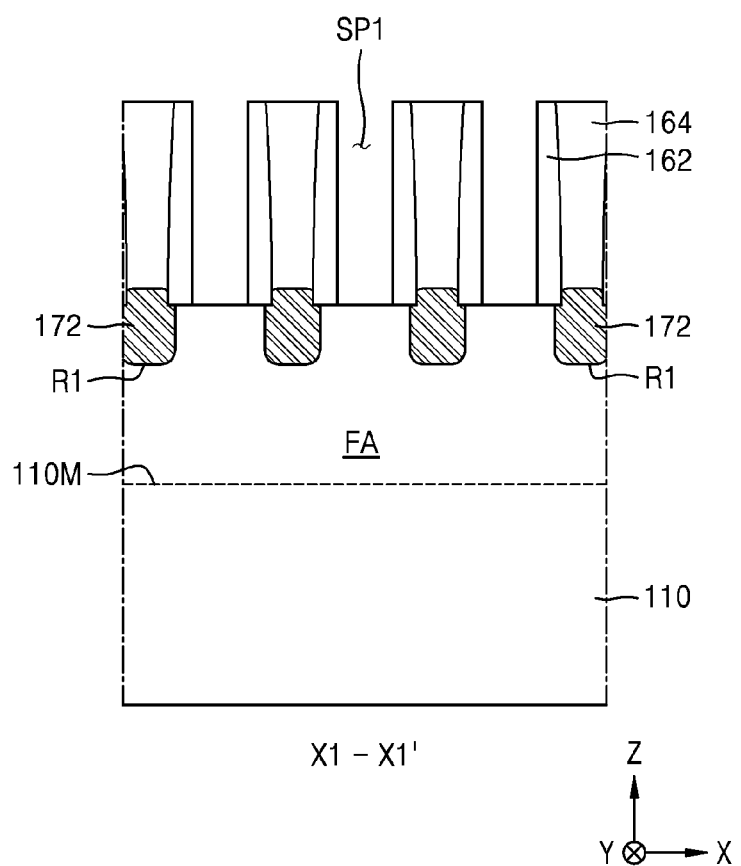
Figure 10D:
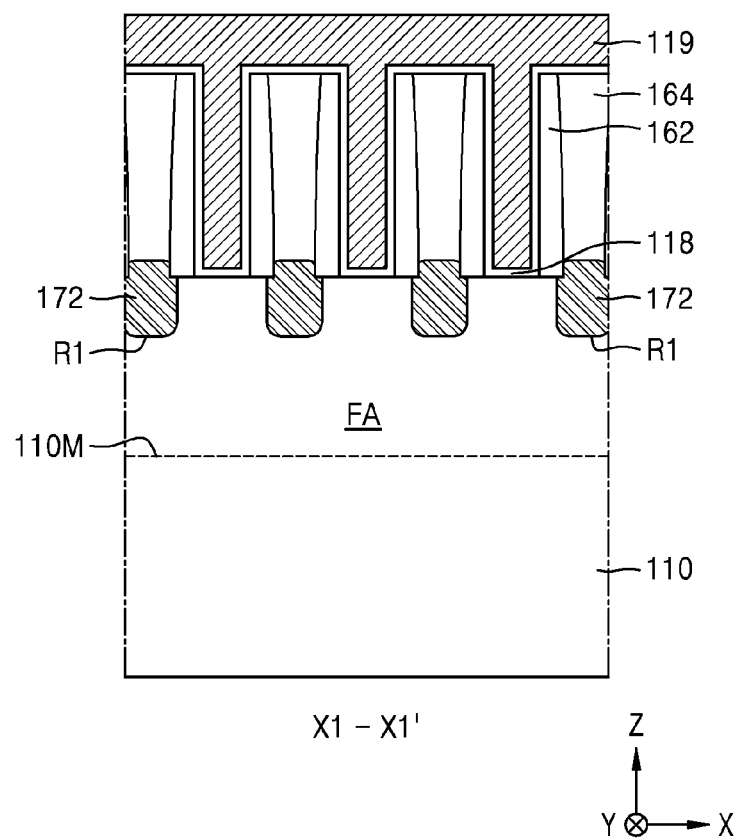
Figure 10E:
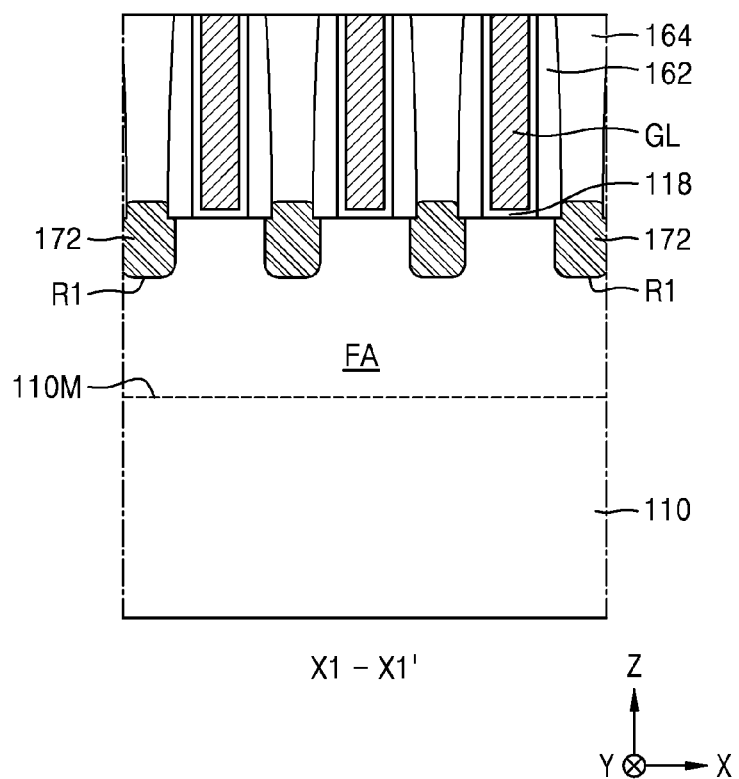
Figure 10F:
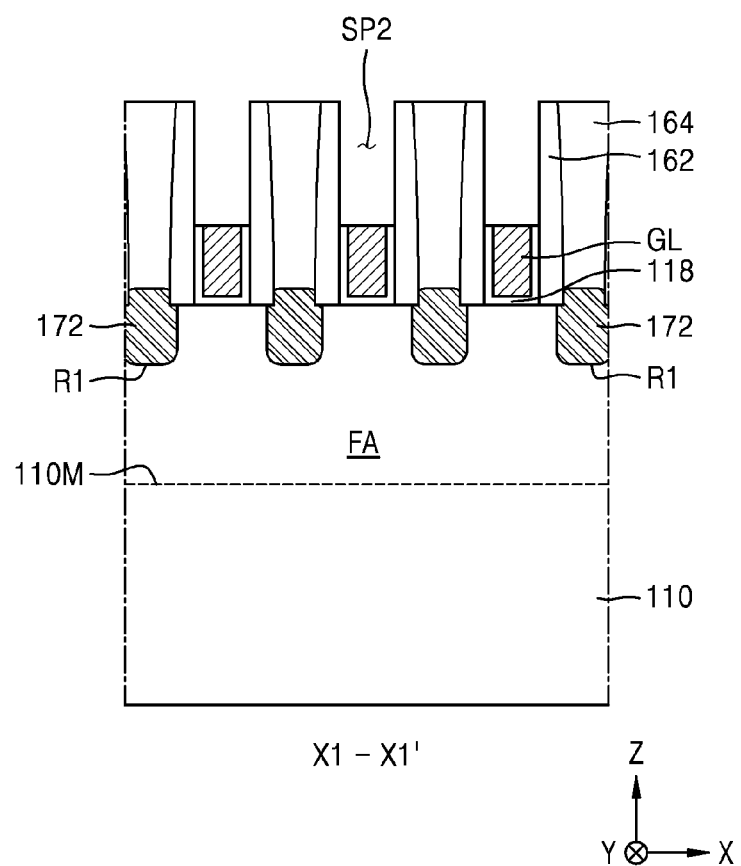
Figure 10G:
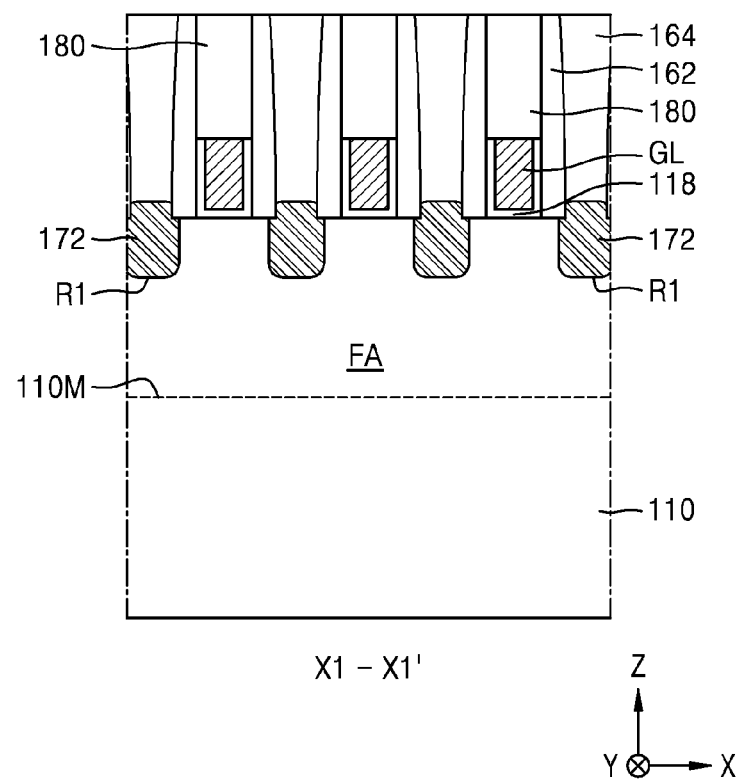
Figure 10H:
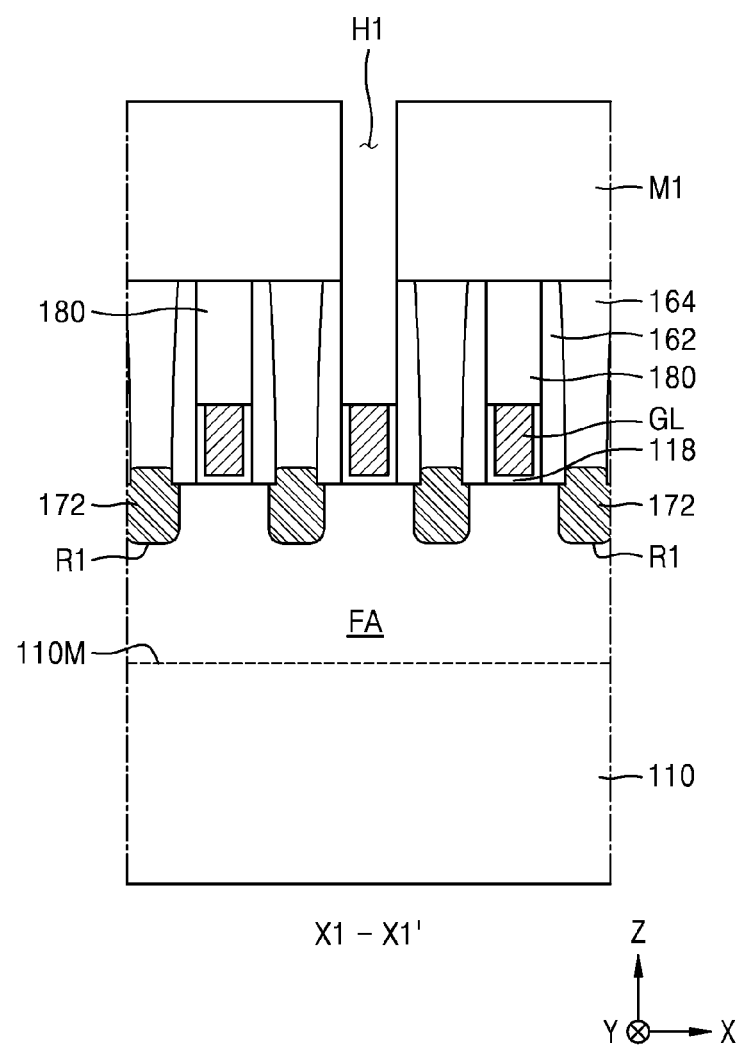
Figure 10I:
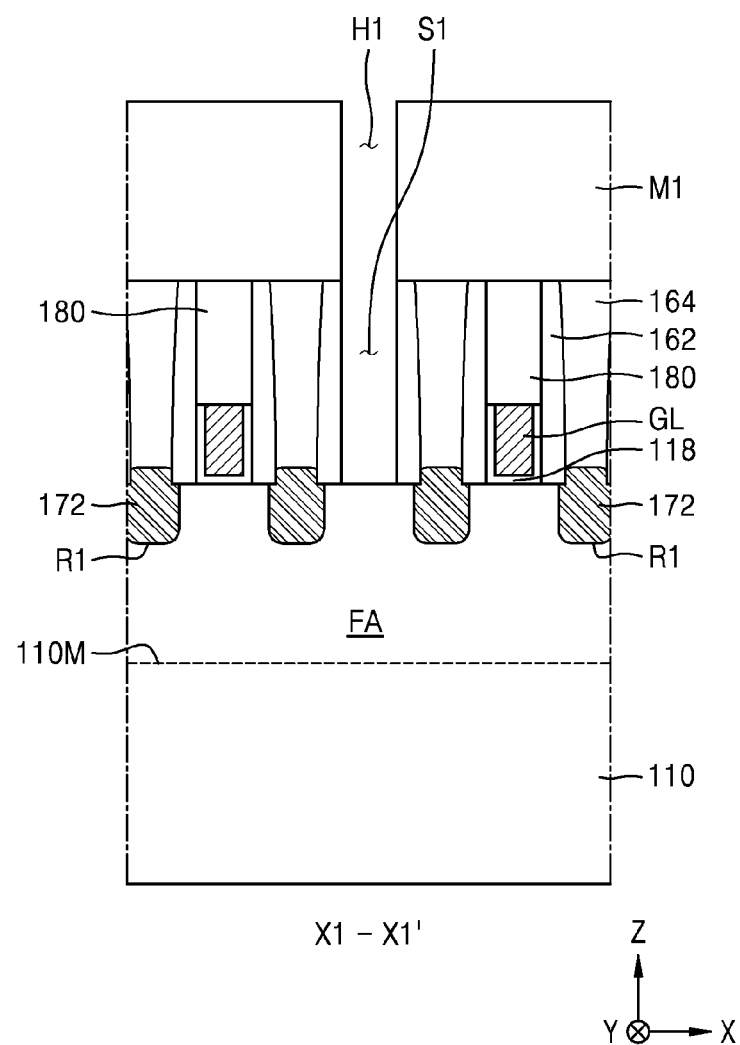
Figure 10J:
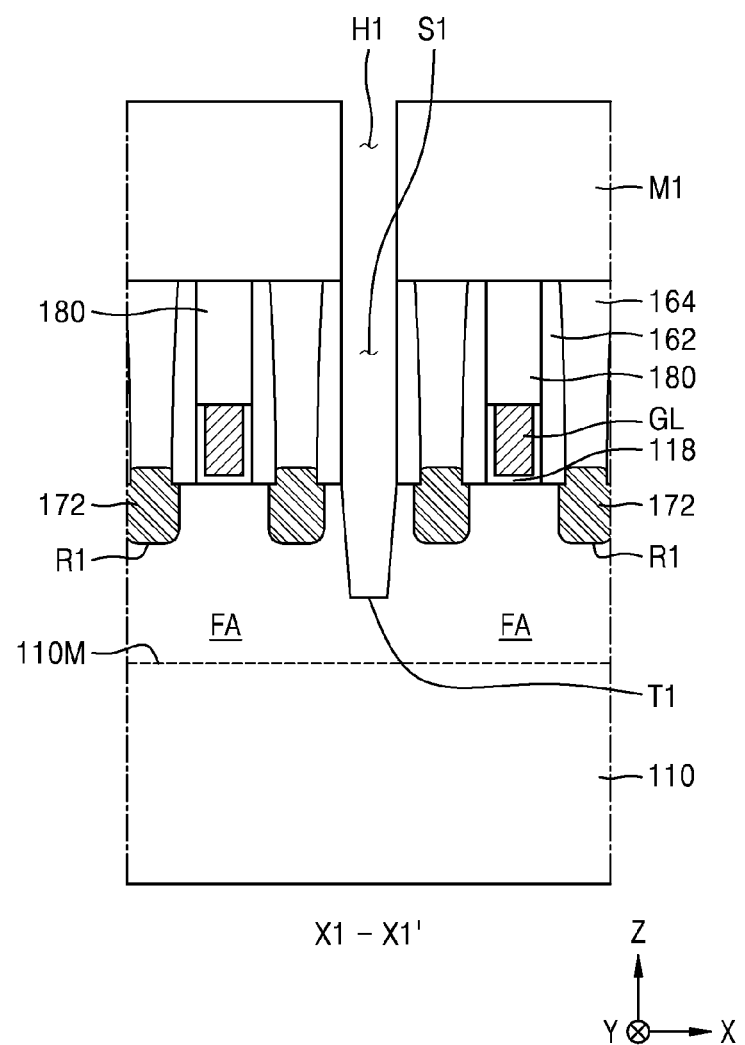
Figure 10K:
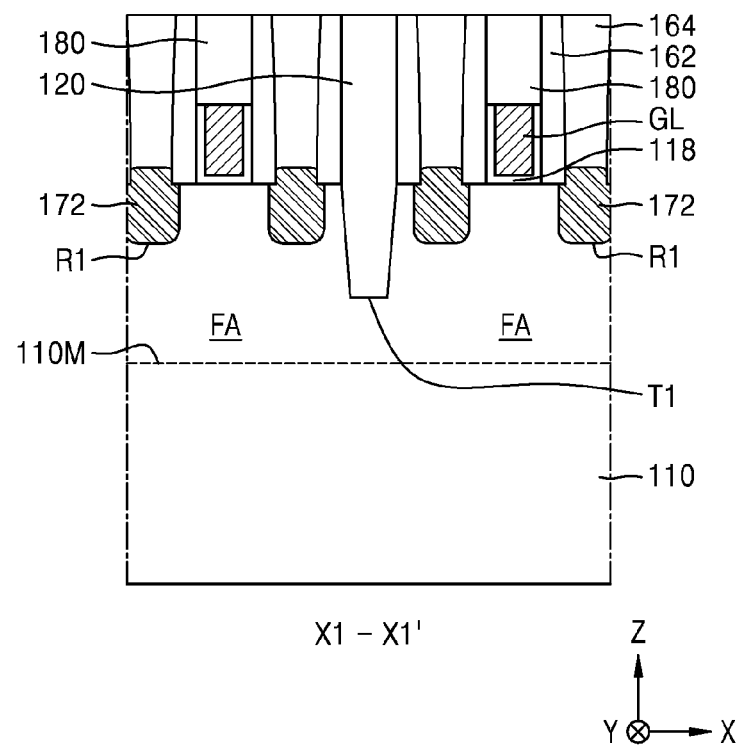
Figure 10L:
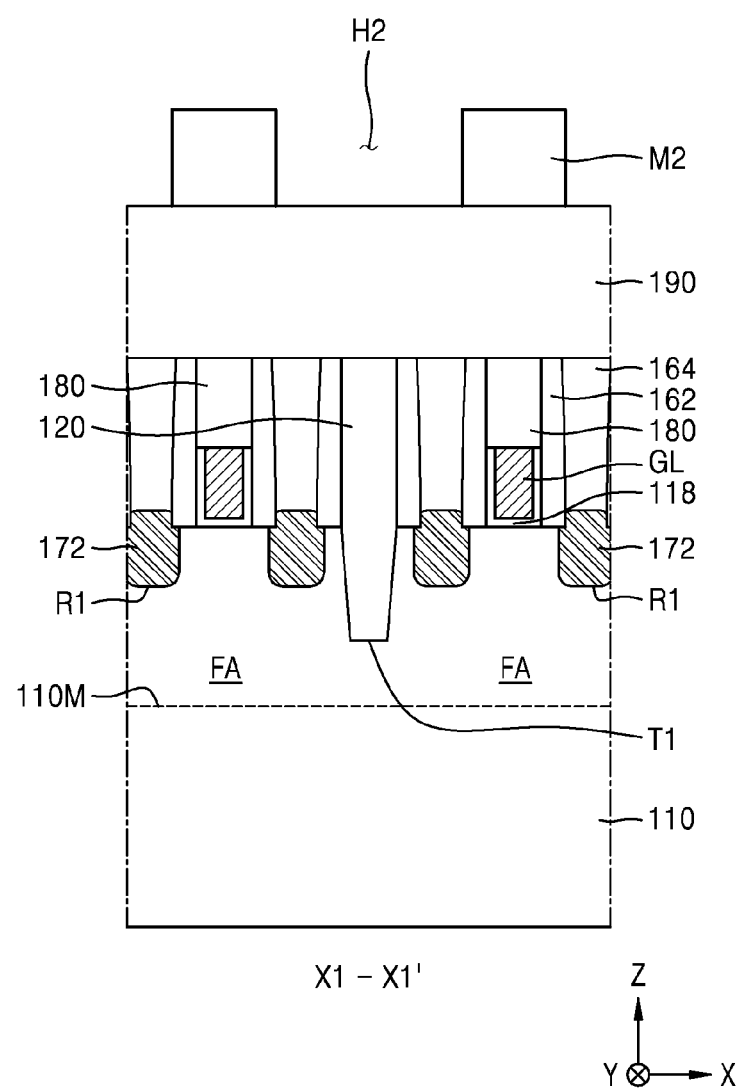
Figure 10M:
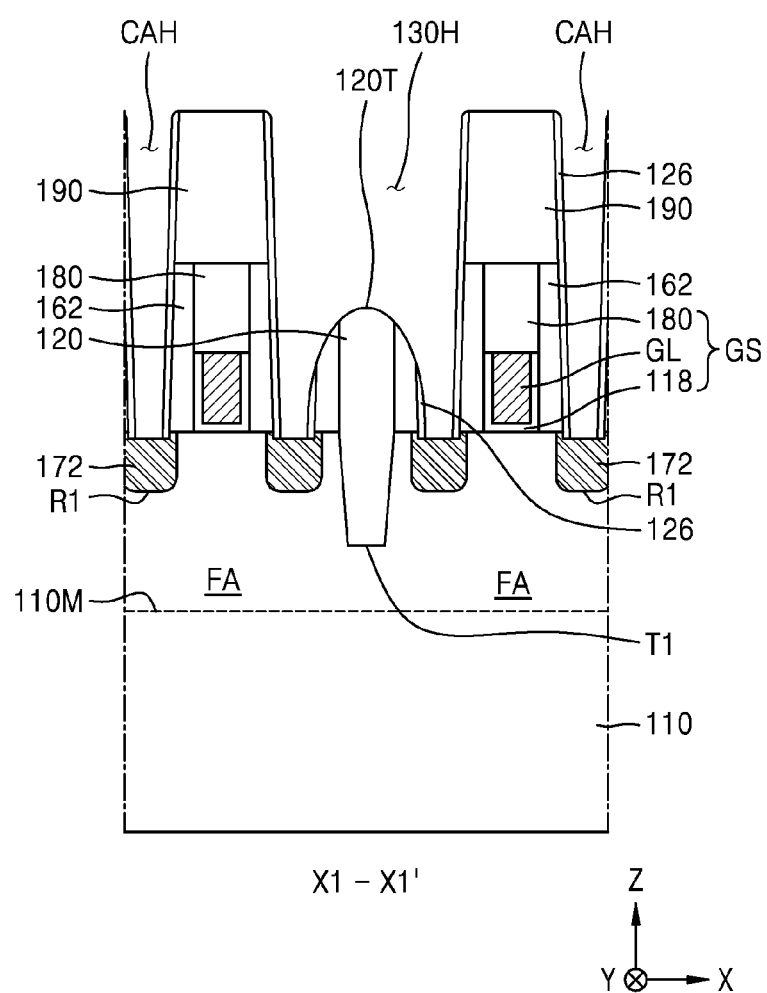
Figure 10N:
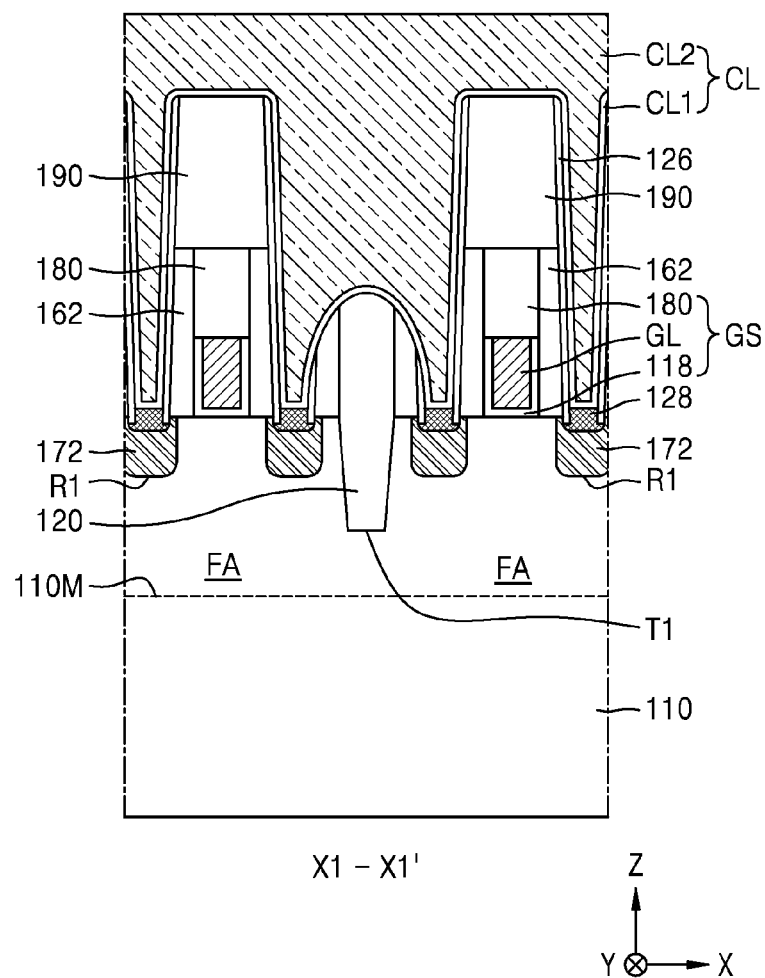
Figure 10O:
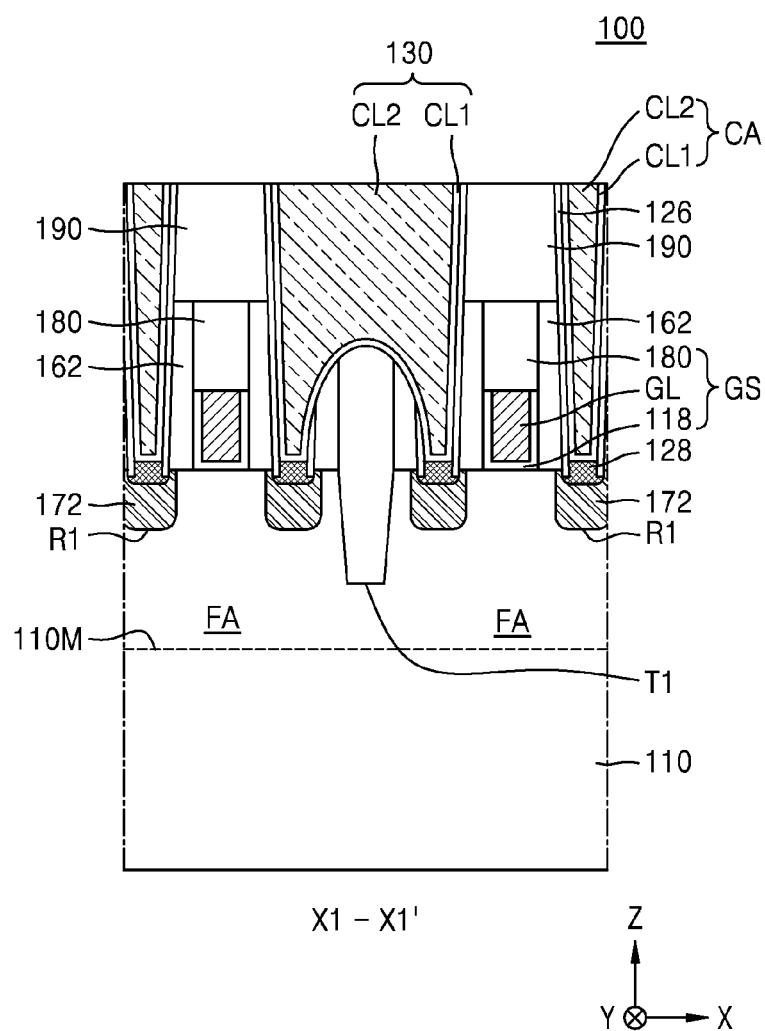

FIGS. 10A through 10O are cross-sectional views for explaining a method of manufacturing an integrated circuit device according to a process order according to example embodiments. A method of manufacturing the integrated circuit device 100 of FIGS. 2A through 2D and the integrated circuit device 200 of FIG. 3 will now be explained with reference to FIGS. 10A through 10O. FIGS. 10A through 10O are cross-sectional views taken along line X1-X1' of FIG. 1 according to a process order according to example embodiments.

Referring to FIG. 10A, the plurality of fin-type active regions FA protruding from the main surface 110M upward (e.g., in a Z direction) and extending in one direction (e.g., the X direction) are formed by etching a part of the substrate 110, and the first device region RX1, the second device region RX2, and the inter-device isolation region DTA are defined.

The device isolation film 112 (see FIG. 2C) that covers both lower side walls of the fin-type active regions FA is formed on the substrate 110. The device isolation film 112 may be formed in the first device region RX1, the second device region RX2, and the inter-device isolation region DTA. The fin-type active regions FA in the first device region RX1 and the second device region RX2 may protrude beyond a top surface of the device isolation film 112.

Referring to FIG. 10B, a plurality of dummy gate structures DGS located over the plurality of fin-type active regions FA and extending to intersect the plurality of fin-type active regions FA are formed. Each of the plurality of dummy gate structures DGS may include a dummy gate dielectric film D14, a dummy gate line D16, and a dummy gate insulating capping layer D18 that are sequentially stacked on the fin-type active regions FA. The dummy gate dielectric film D14 may include silicon oxide, the dummy gate line D16 may include polysilicon, and the dummy gate insulating capping layer D18 may include silicon oxide, silicon nitride, or silicon oxynitride.

The insulating spacers 162 may be formed at both side walls of each of the dummy gate structure DGS. In some embodiments, the plurality of insulating spacers 162 may include material films having a dielectric constant less than that of silicon nitride films, for example, SiOCN films, SiCN films, or a combination thereof. In order to form the insulating spacers 162, atomic layer deposition (ALD) or chemical vapor deposition (CVD) may be used.

The plurality of recess portions R1 may be formed by etching some of the fin-type active regions FA exposed at both sides of the dummy gate structure DGS, and the plurality of source/drain regions 172 may be formed by forming semiconductor layers by using epitaxial growth from the plurality of recess portions R1. The plurality of source/drain regions 172 may have top surfaces whose levels are equal to or higher than those of top surfaces of the fin-type active regions FA.

The inter-gate insulating film 164 that covers the plurality of source/drain regions 172, the plurality of dummy gate structures DGS, and the insulating spacers 162 may be formed. In order to form the inter-gate insulating film 164, an insulating film that covers a structure including the plurality of dummy gate structures DGS and the plurality of source/drain regions 172 to a sufficient thickness may be formed, and then may be planarized to expose top surfaces of the dummy gate insulating capping layers D18, thereby forming the inter-gate insulating film 164 including a remaining portion of the insulating film.

Referring to FIG. 10C, a plurality of gate spaces SP1 are formed by removing the plurality of dummy gate structures DGS from a resultant structure of FIG. 10B. The insulating spacers 162, the fin-type active regions FA, and the device isolation film 112 (see FIG. 2C) may be exposed through the plurality of gate spaces SP1.

Wet etching may be used to remove the plurality of dummy gate structures DGS. In some embodiments, in order to perform the wet etching, an etching solution including, for example, $HNO_3$, diluted fluoric acid (DHF), $NH_4OH$, tetramethyl ammonium hydroxide (TMAH), KOH, or a combination thereof may be used.

Referring to FIG. 10D, the gate dielectric film 118 and a gate conductive layer 119 are formed in the plurality of gate spaces SP1 (see FIG. 10C). Before the gate dielectric film 118 is formed, an interface film (not shown) may be further formed on surfaces of the fin-type active regions FA exposed through the plurality of gate spaces SP1. The interface film may be obtained by oxidizing some of the fin-type active regions FA exposed through the plurality of gate spaces SP1.

The gate dielectric film 118 and the gate conductive layer 119 may fill the gate spaces SP1 and may cover a top surface of the inter-gate insulating film 164. The gate dielectric film 118 and the gate conductive layer 119 may be formed by using ALD, CVD, physical vapor deposition (PVD), metal organic ALD (MOALD), or metal organic CVD (MOCVD).

Referring to FIG. 10E, unnecessary portions of the gate dielectric film 118 and the gate conductive layer 119 (see FIG. 10D) are removed to expose a top surface of the inter-gate insulating film 164. As a result, the plurality of gate dielectric films 118 and the gate conductive layers 119 may remain only in the plurality of gate spaces SP1 (see FIG. 10C). The plurality of gate conductive layers 119 remaining in the plurality of gate spaces SP1 may constitute the plurality of gate lines GL.

Referring to FIG. 10F, a plurality of capping spaces SP2 are formed over the plurality of gate lines GL in the plurality of gate spaces SP1 by removing some of upper portions of the plurality of gate lines GL and the plurality of gate dielectric films 118.

Referring to FIG. 10G, the plurality of gate insulating capping layers 180 that fill the plurality of capping spaces SP2 are formed from a resultant structure of FIG. 10F.

In order to form the gate insulating capping layers 180, an insulating film having a thickness great enough to fill the plurality of capping spaces SP2 may be formed, and then unnecessary portions of the insulating film may be removed to expose a top surface of the inter-gate insulating film 164. The insulating film may include a silicon nitride film.

Referring to FIG. 10H, a mask pattern M1 having a hole H1 formed to correspond to a position of one gate line GL selected from among the plurality of gate lines GL is formed on a resultant structure of FIG. 10G, and the gate insulating capping layer 180 exposed through the hole H1 is etched by using the mask pattern M1 as an etching mask to expose the selected gate line GL and the gate dielectric film 118 covering side walls of the selected gate line GL through the hole H1.

The mask pattern M1 may be formed of a material having an etch selectivity different from those of materials of the gate insulating capping layer 180, the gate line GL, and the gate dielectric film 118. For example, the mask pattern M1 may include, but is not limited to, an oxide film, a metal nitride film, a spin on hardmask (SOH) film, a SiON film, a photoresist film, or a combination thereof.

Referring to FIG. 10I, the selected gate line GL and the gate dielectric film 118 located under the selected gate line GL which are exposed through the hole H1 are removed by using the mask pattern M1 as an etching mask. As a result, a separation space S1 that communicates with the hole H1 may be formed. A top surface of the fin-type active region FA may be exposed through the hole H1 and the separation space S1.

Referring to FIG. 10J, the fin separation trench T1 that communicates with the separation space S1 is formed in the fin-type active region FA by etching the fin-type active region FA exposed through the hole H1 and the separation space S1 by using the mask pattern M1 as an etching mask.

When the fin separation trench T1 is formed, in order to form a structure of FIG. 2C, the device isolation film 112 that covers both side walls of the fin-type active region FA may also be etched while the fin-type active region FA for forming the fin separation trench T1 is formed. As a result, a structure where a bottom surface of the fin separation trench T1 and a top surface of the device isolation film 112 extend at substantially the same level may be obtained in a region exposed through the hole H1, and the separation space S1 may have a bottom surface that extends substantially evenly in the Y direction.

In contrast, when the fin separation trench T1 is formed, in order to form the integrated circuit device 200 of FIG. 3, a structure in which a bottom surface of the fin separation trench T1 and a top surface of the device isolation film 112 extend at different levels may be formed in a region exposed through the hole H1 as shown in FIG. 3 by adjusting an etch selectivity between the fin-type active region FA and the device isolation film 112 according to needs during a process of etching the fin-type active region FA for forming the fin separation trench T1. In this case, a bottom surface of the separation space S1 may have an uneven profile in the Y direction.

Although not shown, before the fin-type active region FA is etched in order to form the fin separation trench T1 in the fin-type active region FA, a process of forming an insulating liner (not shown) that covers side walls of a pair of insulating spacers 162 exposed through the separation space S1 that communicates with the hole H1 may be further performed. The insulating liner may include a silicon nitride film. When the fin-type active region FA is etched through the separation space S1 after the insulating liner is formed, a width of the fin separation trench T1 in the X direction may be less than that in FIG. 10J.

Referring to FIG. 10K, a buried insulating film having a thickness great enough to fill the fin separation trench T1 and the separation space S1 (see FIG. 10J) is formed, and then the insulating separation structure 120 that fills the fin separation trench T1 and the separation space Si is formed by removing unnecessary portions of the buried insulating film to expose a top surface of the gate insulating capping layer 180.

Thus, the portion of the insulating separation structure 120 may be located at the same vertical level as the plurality of gate lines GL.

In some embodiments, the buried insulating film may include a single insulating film, or a multi-layer structure including a plurality of insulating films. In other embodiments, the buried insulating film may include an air gap. The buried insulating film may include, but is not limited to, a silicon oxide film, a silicon nitride film, a SiOCN film, a SiCN film, or a combination thereof.

Referring to FIG. 10L, the interlayer insulating film 190 that is planarized is formed on a resultant structure including the insulating separations structure 120, and then a mask pattern M2 is formed on the interlayer insulating film 190. The mask pattern M2 may include a plurality of holes H2 through which a top surface of the interlayer insulating film 190 is exposed in regions corresponding to the plurality of source/drain contact plugs CA and the jumper contact 130 of FIG. 1.

The mask pattern M2 may be formed of a material having an etch selectivity different from those of materials of the inter-gate insulating film 164 and the interlayer insulating film 190. For example, the mask pattern M2 may include, but is not limited to, an oxide film, a metal nitride film, a SOH film, a SiON film, a photoresist film, or a combination thereof.

Referring to FIG. 10M, the inter-gate insulating film 164, the insulating separation structure 120, and the insulating spacers 162 that cover both side walls of the insulating separation structure 120 are exposed through the plurality of holes H2 by etching the interlayer insulating film 190 exposed through the plurality of holes H2 from a resultant structure of FIG. 10L, and then a plurality of first contact holes CAH and a jumper contact hole 130H through which the plurality of source/drain regions 172 are exposed are formed by etching the exposed inter-gate insulating film 164. In example embodiments, the plurality of first contact holes CAH and a jumper contact hole 130H are simultaneously formed. Next, the mask pattern M2 may be removed.

Before or after the plurality of first contact holes CAH and the jumper contact hole 130H are formed, a mask pattern (not shown) including a plurality of holes through which a top surface of the interlayer insulating film 190 is exposed may be formed on the interlayer insulating film 190 in regions corresponding to the plurality of gate contact plugs CB of FIG. 1, and a plurality of second contact holes (not shown) through which top surfaces of the gate lines GL are exposed may be formed by etching the interlayer insulating film 190 and the gate insulating capping layers 180 located under the interlayer insulating film 190 which are exposed through the plurality of holes by using the mask pattern as an etching mask. In a process described below with reference to FIGS. 10N and 10O, the plurality of gate contact plugs CB of FIGS. 2C and 2D may be formed in the plurality of second contact holes.

Referring back to FIG. 10M, the insulating liner 126 may be formed inner side walls of the plurality of first contact holes CAH and the jumper contact hole 130H.

In order to form the insulating liner 126, an insulating thin film that conformably covers an exposed surface of a resultant structure including the plurality of first contact holes CAH and the jumper contact hole 130H may be formed, and then the plurality of source/drain regions 172 may be exposed trough the plurality of first contact holes CAH and the jumper contact hole 130H by etching back the insulating thin film. The insulating liner 126 may include, but is not limited to, a silicon nitride film.

In some embodiments, while the insulating liner 126 is formed on the inner side walls of the plurality of first contact holes CAH and the jumper contact hole 130H, the insulating liner 126 may also be formed on inner side walls of a plurality of second contact holes (not shown) for forming the plurality of gate contact plugs CB of FIGS. 2C and 2D. In other embodiments, a process of forming the insulating liner 126 on inner side walls of the plurality of second contact holes (not shown) may be performed separately before or after a process of forming the insulating liner 126 on inner side walls of the plurality of first contact holes CAH and the jumper contact hole 130H.

Referring to FIG. 10N, the metal silicide film 128 that covers the source/drain regions 172 in the plurality of first contact holes CAH and the jumper contact hole 130H, and a conductive film CL that fills the plurality of first contact holes CAH and the jumper contact hole 130H are formed. As an example, the conductive film CL that fills the plurality of first contact holes CAH and the jumper contact hole 130H may be simultaneously formed so as to form the source/drain contact plugs CA and the jumper contact 130.

The conductive film CL may include a conductive barrier film CL1 that conformably covers a top surface of the interlayer insulating film 190 and inner side walls of the plurality of first contact holes CAH and the jumper contact hole 130H, and a buried metal film CL2 that is located on the conductive buried film CL1 and fills the plurality of first contact holes CAH and the jumper contact hole 130H. The buried metal film CL2 may fill the plurality of first contact holes CAH and the jumper contact hole 130H and may be located on a top surface of the interlayer insulating film 190 to cover the conductive barrier film CL1. In some embodiments, the conductive barrier film CL1 may be formed of Ti, Ta, TiN, TaN, or a combination thereof, and the buried metal film CL2 may be formed of Co, Cu, W, Ru, Mn, or a combination thereof.

In some embodiments, the following processes may be performed in order to form the metal silicide film 128 and the conductive barrier film CL1. First, a first metal film that covers the source/drain regions 172 in the plurality of first contact holes CAH and the jumper contact hole 130H may be formed. The first metal film may be formed of Ti, W, Ru, Nb, Mo, Hf, Ni, Co, Pt, Yb, Tb, Dy, Er, Pd, or a combination thereof. Next, the conductive barrier film CL1 that covers an exposed surface of the first metal film and inner side walls of the plurality of first contact holes CAH and the jumper contact hole 130H may be formed. In some embodiments, the conductive barrier film CL1 may include a conductive metal nitride film. For example, the conductive barrier film CL1 may be formed of TiN, TaN, AlN, WN, or a combination thereof. The first metal film and the conductive barrier film CL1 may be formed by using PVD, CVD, or ALD. Next, the metal silicide film 128 that covers the source/drain regions 172 may be formed by inducing an interaction between a semiconductor material of the source/drain regions 172 and a metal of the first metal film by thermally treating a resultant structure including the first metal film and the conductive barrier film CL1. In some embodiments, after the metal silicide film 128 is formed, a part of the first metal film may remain between the metal silicide film 128 and the conductive barrier film CL1. In other embodiments, the first metal film may be used to form the metal silicide film 128 while the metal silicide film 128 is formed, and thus the first metal film may not remain between the metal silicide film 128 and the conductive barrier film CL1.

Next, the buried metal film CL2 may be formed by forming a second metal film having a thickness great enough to fill the plurality of first contact holes CAH and the jumper contact hole 130H on a resultant structure including the metal silicide film 128 and the conductive barrier film CL1. CVD, PVD, or electroplating may be used to form the buried metal film CL2.

Although not shown in FIG. 10N, while the conductive film CL is formed in the plurality of first contact holes CAH and the jumper contact hole 130H, the conductive film CL may also be formed in the plurality of second contact holes (not shown) for forming the plurality of gate contact plugs CB of FIGS. 2C and 2D.

Referring to FIG. 10O, the conductive barrier film CL1 and the buried metal film CL2 may remain only in the plurality of first contact holes CAH and the jumper contact hole 130H by removing unnecessary portions of the conductive barrier film CL1 and the buried metal film CL2 until a top surface of the interlayer insulating film 190 is exposed. As a result, the plurality of source/drain contact plugs CA including the conductive barrier film CL1 and the buried metal film CL2 remaining in the plurality of first contact holes CAH and the jumper contact 130 including the conductive barrier film CL1 and the buried metal film CL2 remaining in the jumper contact hole 130H may be obtained. Although not shown in FIG. 10O, while the plurality of source/drain contact plugs CA and the jumper contact 130 are formed, the plurality of gate contact plugs CB of FIGS. 2C and 2D may also be formed, and like the plurality of source/drain contact plugs CA and the jumper contact 130, the plurality of gate contact plugs CB may each include the conductive barrier film CL1 and the buried metal film CL2.

Chemical mechanical polishing (CMP) may be used to remove unnecessary portions of the conductive barrier film CL1 and the buried metal film CL2.

In example embodiments, the jumper contact 130 may be formed with the plurality of source/drain contact plugs CA by the same processing step.

FIGS. 11A through 11H are cross-sectional views for explaining a method of manufacturing an integrated circuit device according to a process order according to example embodiments. A method of manufacturing the integrated circuit device 300 of FIGS. 4A and 4B and the integrated circuit device 400 of FIGS. 5A and 5B will be explained with reference to FIGS. 11A through 11H. FIGS. 11A through 11H are cross-sectional views taken along line X1-X1' of FIG. 1 according to a process order.

Figure 11A:
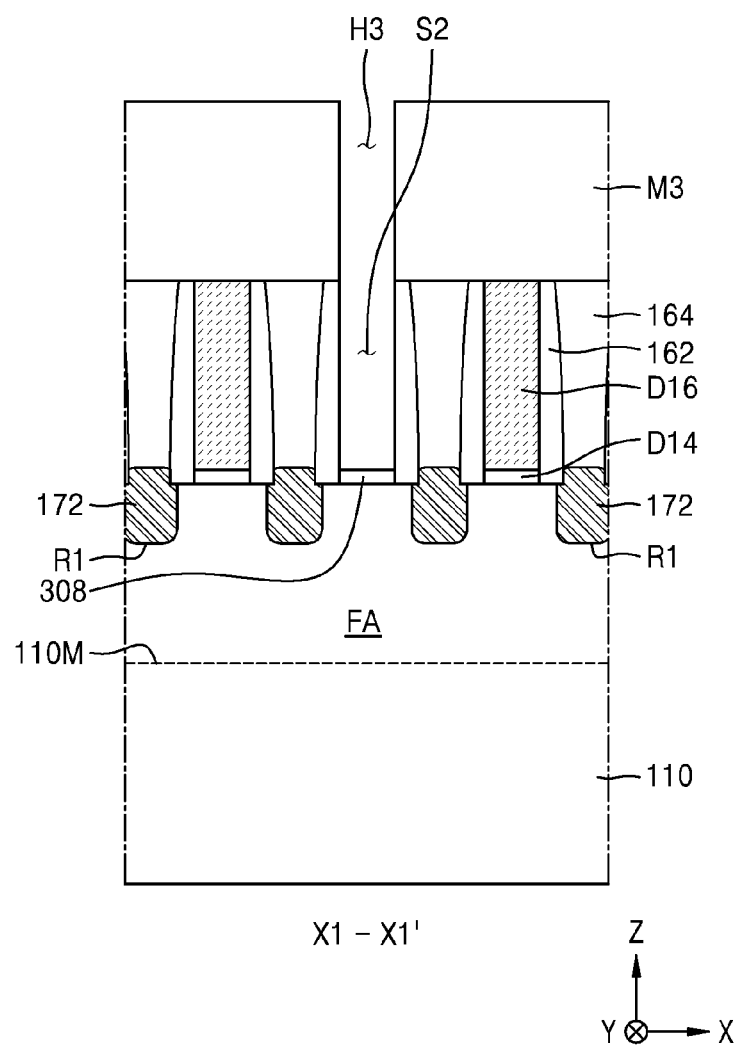
FIGS. 11A through 11H are cross-sectional views for explaining a method of manufacturing an integrated circuit device according to a process order according to example embodiments.

Referring to FIG. 11A, processes of forming the plurality of dummy gate structures DGS on the fin-type active regions FA of the substrate 110, the insulating spacers 162 covering both side walls of the plurality of dummy gate structures DGS, the plurality of source/drain regions 172, and the inter-gate insulating film 164 are performed by using the same method as that described with reference to FIGS. 10A and 10B, and then a resultant structure of FIG. 10B is planarized to expose top surfaces of the plurality of dummy gate lines D16. Next, a mask pattern M3 is formed on a resultant structure that is planarized to expose the top surfaces of the plurality of dummy gate lines D16. The mask pattern M3 may include a hole H3 through which the dummy gate line D16 of the dummy gate structure DGS selected from among the plurality of dummy gate structures DGS is exposed.

Next, an insulating space S2 that exposes the dummy gate insulating film D14 through the hole H3 is formed by etching the dummy gate line D16 exposed through the hole H3 by using the mask pattern M3 as an etching mask. The dummy gate insulating film D14 exposed through the insulating space S2 may constitute the dummy gate dielectric film 308 of FIGS. 4A and 4B.

In other embodiments, after the dummy gate dielectric film D14 is exposed by etching the dummy gate line D16 exposed through the insulating space S2, the fin-type active region FA and the device isolation film 112 (see FIGS. 4A and 4B) may be exposed by removing the exposed dummy gate dielectric film D14, and the dummy gate dielectric film 308 of FIGS. 4A and 4B may be formed by forming a new dielectric film on a surface of the fin-type active region FA exposed through the insulating space S2. An oxide film may be grown from the surface of the fin-type active region FA that is exposed in order to form the new insulating film.

In other embodiments, in order to form the integrated circuit device 400 of FIGS. 5A and 5B, the fin-type active region FA and the device isolation film 112 (see FIGS. 4A and 4B) are exposed through the insulating space S2 by removing the dummy gate dielectric film D14 exposed through the insulating space S2, and then a process of FIG. 11B may be performed as described below.

Figure 11B:
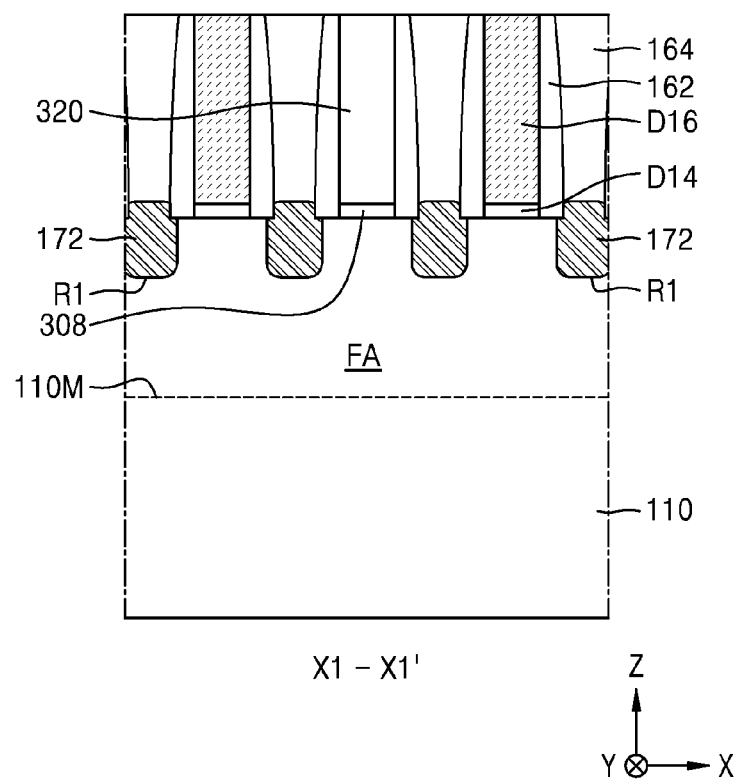

Referring to FIG. 11B, after the mask pattern M3 is removed from a resultant structure of 11A, a buried insulating film having a thickness great enough to fill the insulating space S2 (see FIG. 11A) is formed by using a method similar to that described with reference to FIG. 10K, and the insulating separation structure 320 that fills the insulating space S2 is formed by removing unnecessary portions of the buried insulating film to expose a top surface of the inter-gate insulating film 164. A detailed configuration of the buried insulating film is the same as that described with reference to FIG. 10K.

Figure 11C:
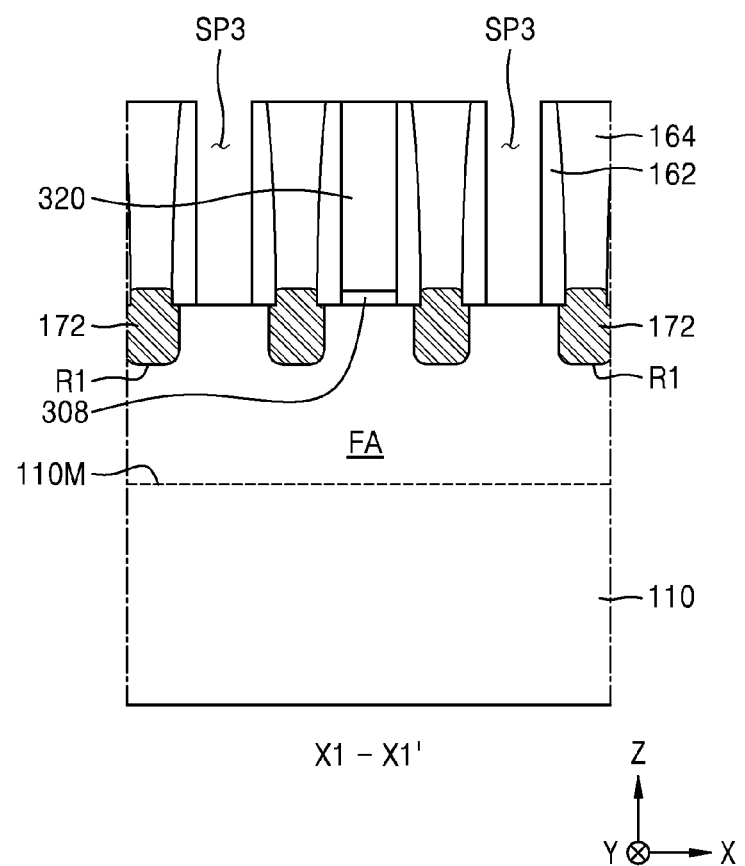

Referring to FIG. 11C, a plurality of gate spaces SP3 are formed by removing remaining portions of the plurality of dummy gate structures DGS from a resultant structure of FIG. 11B by using a method similar to that described with reference to FIG. 10C. The insulating spacers 162, the fin-type active region FA, and the device isolation film 112 (see FIGS. 4A and 4B) may be exposed through the plurality of gate spaces SP3.

Figure 11D:
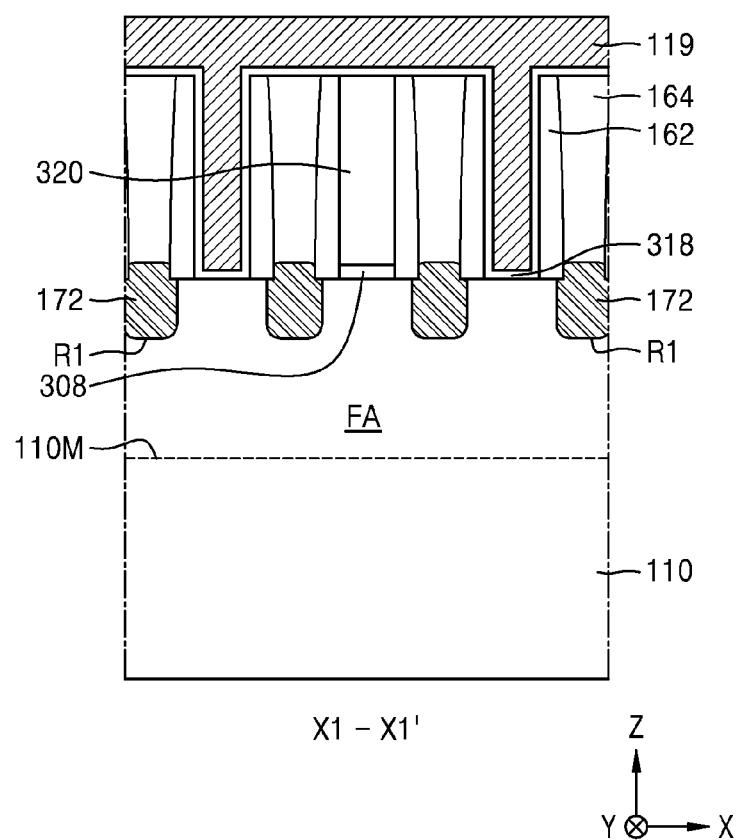

Referring to FIG. 11D, the gate dielectric film 318 and the gate conductive layer 119 are formed in the plurality of gate spaces SP3 (see FIG. 11C) by using a method similar to a method of forming the gate dielectric film 118 and the gate conductive layer 119 described with reference to FIG. 10D. Before the gate dielectric film 318 is formed, an interface film (not shown) may be further formed on surfaces of the fin-type active region FA exposed through the plurality of gate spaces SP3. Some parts of the fin-type active region FA exposed through the plurality of gate spaces SP3 may be oxidized in order to form the interface film.

Figure 11E:
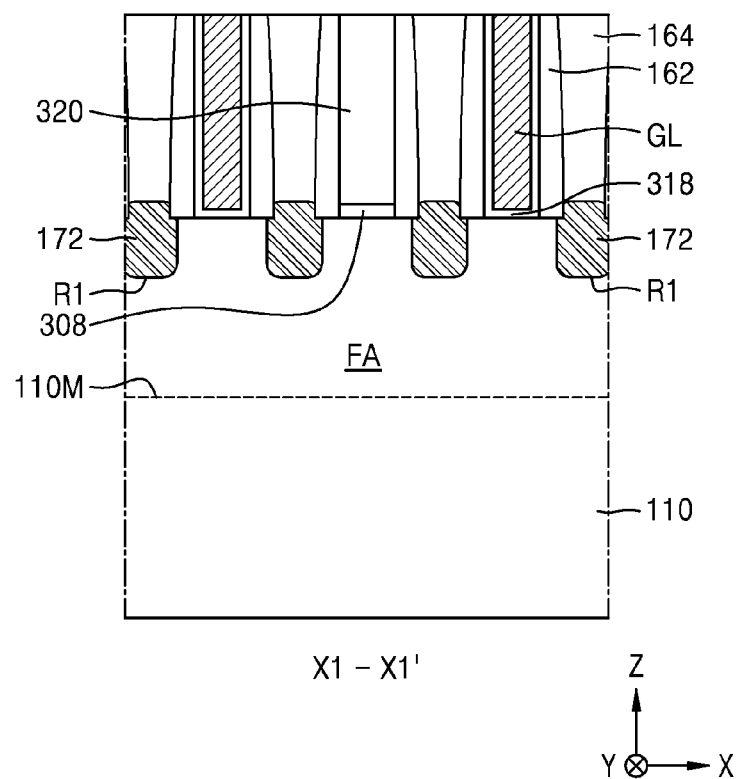

Referring to FIG. 11E, a top surface of the inter-gate insulating film 164 and a top surface of the insulating separation structure 320 may be exposed by removing unnecessary portions of the gate dielectric film 318 and the gate conductive layer 119 (see FIG. 11D) by using a method similar to that described with reference to FIG. 10E, and the plurality of gate dielectric films 318 and the gate conductive layers 119 may remain only in the plurality of gate spaces SP3 (see FIG. 11C). The gate conductive layers 119 remaining in the plurality of gate spaces SP3 may constitute the plurality of gate lines GL.

Figure 11F:
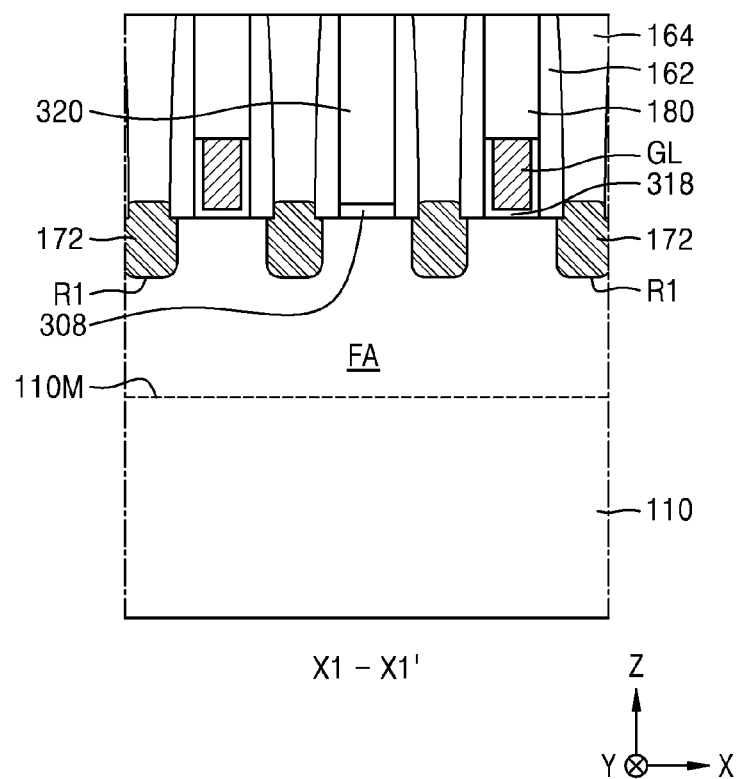

Referring to FIG. 11F, some of the plurality of gate spaces SP3 are emptied by removing some upper portions of the plurality of gate lines GL and the plurality of gate dielectric films 318 by using a method similar to that described with reference to FIGS. 10F and 10G, and then the plurality of gate insulating capping layers 180 that cover the plurality of gate lines GL and the plurality of gate dielectric films 318 in the plurality of gate spaces SP3 are formed.

Figure 11G:
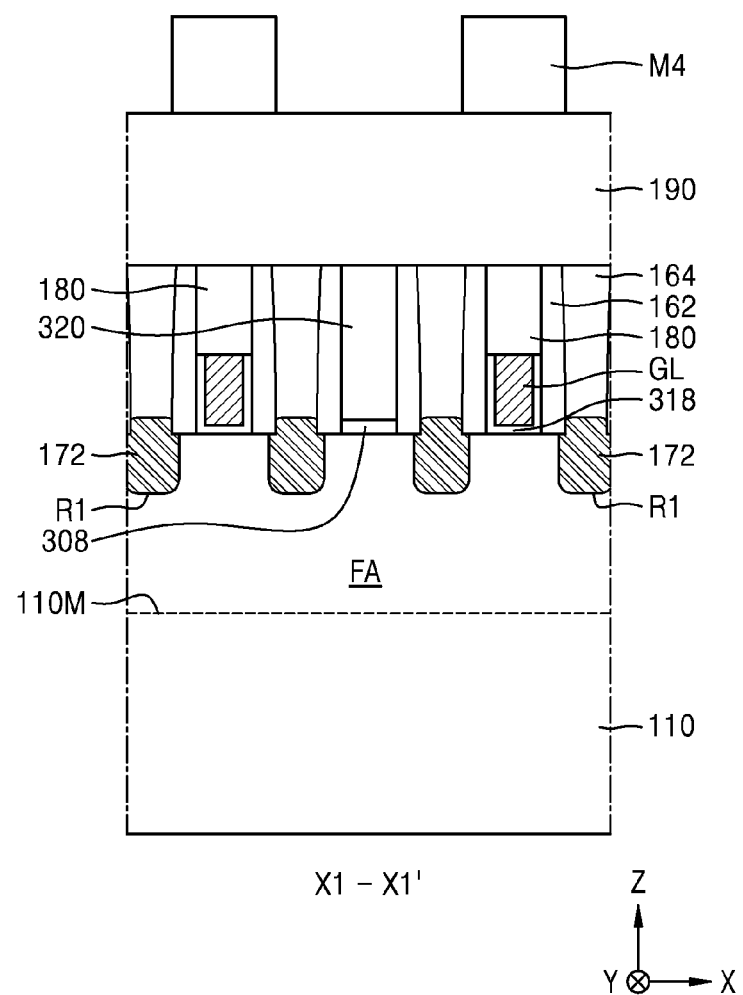

Referring to FIG. 11G, the interlayer insulating film 190 is formed on a resultant structure including the insulating separation structure 320 and the plurality of gate insulating capping layers 180 by using a method similar to that described with reference to FIG. 10L, and a mask pattern M4 is formed on the interlayer insulating film 190. The mask pattern M4 may have a substantially the same configuration as that of the mask pattern M2 of FIG. 10L.

Figure 11H:
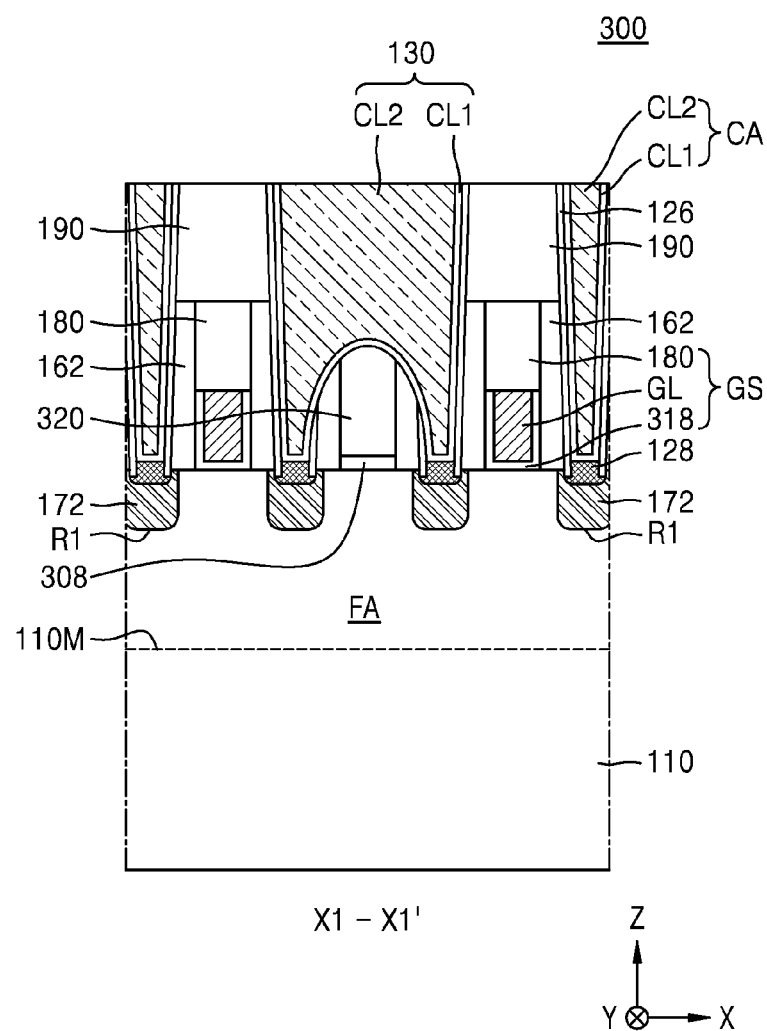

Referring to FIG. 11H, the plurality of source/drain contact plugs CA and the jumper contact 130 including the conductive barrier film CL1 and the buried metal film CL2 may be formed by performing processes described with reference to FIGS. 10M through 10O. While the plurality of source/drain contact plugs CA and the jumper contact 130 are formed, the gate contact plugs CB of FIG. 4B may also be formed.

Although methods of manufacturing the integrated circuit devices 100, 200, 300, and 400 of FIGS. 1, 2A-2D, 3, 4A, 4B, 5B, and 5B have been described with reference to FIGS. 10A-10O and 11A-11H, it will be understood that various modifications and changes may be made within the scope of the inventive concept to manufacture the integrated circuit devices 500, 600, 700, and 800 of FIGS. 6A-6C and 7-9.

An integrated circuit device according to the present disclosure includes an insulating separation structure located on a fin-type active region and extending in a direction parallel to a gate line, and a jumper contact located on the fin-type active region and connecting a pair of source/drain regions passes over the insulating separation structure, instead of the gate line. Accordingly, a short circuit between the jumper contact and the gate line may be prevented. Also, an additional process for cutting the gate line passing between the pair of source/drain regions in an inter-device separation region may be omitted, and an additional space for cutting the gate line in the inter-device separation region may not need to be secured. Accordingly, an area of the inter-device separation region may be minimized, a size of a logic cell may be reduced, and an insulating distance between contacts in the logic cell having a reduced size may be stably secured.

While the inventive concept has been particularly shown and described with reference to embodiments thereof, it will be understood that various changes in form and details may be made by one of ordinary skill in the art therein without departing from the spirit and scope of the following claims.

What is claimed is:

1. An integrated circuit device comprising:
a fin-type active region extending in a first direction on a substrate;
an insulating separation structure extending in a second direction that intersects the first direction on the fin-type active region;
a pair of gate lines spaced apart from each other, the insulating separation structure being located between the pair of gate lines in the second direction;
a pair of source/drain regions located on the fin-type active region and spaced apart from each other with the insulating separation structure therebetween, a level of a lowermost surface of each of the pair of source/drain regions is higher than a level of a lowermost surface of the insulating separation structure; and
a jumper contact located over the insulating separation structure, the jumper contact comprising a pair of source/drain contact plugs respectively connected to the pair of source/drain regions,
wherein the insulating separation structure comprises a buried separation portion filling a fin separation trench formed in the fin-type active region and a protruding separation portion integrally connected to the buried separation portion, the protruding separation portion extending away from the fin-type active region, and protruding upward beyond a top surface of the fin-type active region.

2. The integrated circuit device of claim 1, wherein the pair of gate lines are aligned with the insulating separation structure in the second direction.

3. The integrated circuit device of claim 1, wherein the jumper contact comprises:
a first via contact plug located over the insulating separation structure and connected between the pair of source/drain contact plugs, wherein the first via contact plug vertically overlaps the insulating separation structure and does not vertically overlap the pair of gate lines.

4. The integrated circuit device of claim 3, wherein a bottom surface of the first via contact plug contacts a top surface of each of the pair of source/drain contact plugs.

5. The integrated circuit device of claim 1, further comprising a device isolation film covering a sidewall of the fin-type active region,
wherein the level of the lowermost surface of the insulating separation structure is higher than a level of a bottom surface of the device isolation film.

6. The integrated circuit device of claim 1, wherein a level of an uppermost surface of the insulating separation structure is higher than a level of an uppermost surface of each of the pair of gate lines.

7. The integrated circuit device of claim 1, wherein the insulating separation structure comprises at least one of a single insulating film, a combination of a plurality of insulating films, and an air gap.

8. The integrated circuit device of claim 1, wherein the pair of gate lines includes a first gate line and a second gate line, and the first gate line is a normal gate line and the second gate line is a dummy gate line.

9. An integrated circuit device comprising:
a fin-type active region extending in a first direction on a substrate;
an insulating separation structure extending in a second direction that intersects the first direction on the fin-type active region;
a pair of gate lines including first and second gate lines spaced apart from each other, the insulating separation structure being located between the first and second gate lines in the second direction;
a pair of source/drain regions located on the fin-type active region and spaced apart from each other with the insulating separation structure therebetween, a level of a lowermost surface of each of the pair of source/drain regions is higher than a level of a lowermost surface of the insulating separation structure;
a jumper contact located over the insulating separation structure, the jumper contact comprising a pair of source/drain contact plugs respectively connected to the pair of source/drain regions;
a conductive line extending in a direction that intersects the first gate line on the first gate line; and
a first via contact plug vertically extending between the first gate line and the conductive line to connect the first gate line and the conductive line,
wherein, in the first direction, a width of the jumper contact is greater than a width of the first via contact plug.

10. The integrated circuit device of claim 9, wherein the jumper contact further comprises a second via contact plug located over the insulating separation structure and connected between the pair of source/drain contact plugs.

11. The integrated circuit device of claim 10, wherein the first gate line is aligned with the insulating separation structure in the second direction, and
wherein the second gate line is aligned with the insulating separation structure and the first gate line in the second direction.

12. The integrated circuit device of claim 9, wherein the first gate line is a normal gate line and the second gate line is a dummy gate line.

13. An integrated circuit device comprising:
a fin-type active region extending in a first direction on a substrate;
an insulating separation structure extending in a second direction that intersects the first direction on the fin-type active region;
in the second direction, a pair of gate lines spaced apart from each other, and the insulating separation structure being located between the pair of gate lines;
a pair of source/drain regions located on the fin-type active region and spaced apart from each other with the insulating separation structure therebetween, a level of a lowermost surface of each of the pair of source/drain regions is higher than a level of a lowermost surface of the insulating separation structure; and
a jumper contact located over the insulating separation structure, the jumper contact comprising a pair of source/drain contact plugs respectively connected to the pair of source/drain regions,
wherein the insulating separation structure comprises at least one of a single insulating film and an air gap.

14. The integrated circuit device of claim 13, wherein the jumper contact further comprises a via contact plug located over the insulating separation structure and connected between the pair of source/drain contact plugs.

15. The integrated circuit device of claim 14, wherein the pair of gate lines includes:
a first gate line aligned with the insulating separation structure in the second direction, and
a second gate line aligned with the insulating separation structure and the first gate line in the second direction, and wherein the insulating separation structure is disposed between the first gate line and the second gate line in the second direction.

* * * * *